(12) United States Patent
Kato

(10) Patent No.: US 9,660,317 B2
(45) Date of Patent: *May 23, 2017

(54) HIGH-FREQUENCY SIGNAL TRANSMISSION LINE

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 98 days.

This patent is subject to a terminal disclaimer.

(21) Appl. No.: 14/735,298

(22) Filed: Jun. 10, 2015

(65) Prior Publication Data

US 2015/0280303 A1    Oct. 1, 2015

Related U.S. Application Data

(60) Division of application No. 14/087,004, filed on Nov. 22, 2013, now Pat. No. 9,312,588, which is a (Continued)

(30) Foreign Application Priority Data

Dec. 3, 2010  (JP) ................................ 2010-270123
May 6, 2011  (JP) ................................ 2011-103644

(51) Int. Cl.
*H01P 3/08* (2006.01)
*H01P 3/00* (2006.01)
(Continued)

(52) U.S. Cl.
CPC .......... *H01P 3/003* (2013.01); *H01P 1/20363* (2013.01); *H01P 3/08* (2013.01); (Continued)

(58) Field of Classification Search
CPC ... H03H 7/38; H01P 3/08; H01P 3/081; H01P 3/082; H01P 3/085; H01P 3/087
(Continued)

(56) References Cited

U.S. PATENT DOCUMENTS

| 8,461,943 B2* | 6/2013 | Kato ................... H01P 1/20363 333/238 |
| 8,624,693 B2* | 1/2014 | Kato ................... H01P 1/20363 333/238 |
| 9,312,588 B2* | 4/2016 | Kato ................... H01P 1/20363 |

OTHER PUBLICATIONS

Kato, "High-Frquency Signal Transmission Line," U.S. Appl. No. 14/087,004, filed Nov. 22, 2013.

* cited by examiner

*Primary Examiner* — Stephen E Jones
(74) *Attorney, Agent, or Firm* — Keating & Bennett, LLP

(57) ABSTRACT

A flexible high-frequency signal transmission line includes a dielectric body including laminated flexible dielectric layers. A signal line is provided in the dielectric body. A grounding conductor is arranged in the dielectric body to be opposed to the signal line via one of the dielectric layers. The grounding conductor is of a ladder structure including a plurality of openings and a plurality of bridges arranged alternately along the signal line. A characteristic impedance of the signal line changes between two adjacent ones of the plurality of bridges such that the characteristic impedance of the signal line rises from a minimum value to an intermediate value and to a maximum value and falls from the maximum value to the intermediate value and to the minimum value in this order.

11 Claims, 16 Drawing Sheets

Related U.S. Application Data continuation of application No. 13/892,342, filed on May 13, 2013, now Pat. No. 8,624,693, which is a continuation of application No. 13/537,838, filed on Jun. 29, 2012, now Pat. No. 8,461,943, which is a continuation of application No. PCT/JP2011/072648, filed on Sep. 30, 2011.

(51) Int. Cl.
  *H03H 7/38* (2006.01)
  *H01P 1/203* (2006.01)
  *H05K 1/02* (2006.01)

(52) U.S. Cl.
  CPC ............... *H01P 3/085* (2013.01); *H03H 7/38* (2013.01); *H05K 1/028* (2013.01); *H05K 1/0242* (2013.01); *H05K 1/0253* (2013.01); *H05K 1/0221* (2013.01); *H05K 1/0225* (2013.01); *H05K 2201/0969* (2013.01); *H05K 2201/09618* (2013.01); *H05K 2201/09727* (2013.01)

(58) Field of Classification Search
  USPC .............................. 333/1, 4, 5, 33, 238, 246
  See application file for complete search history.

FIG. 1
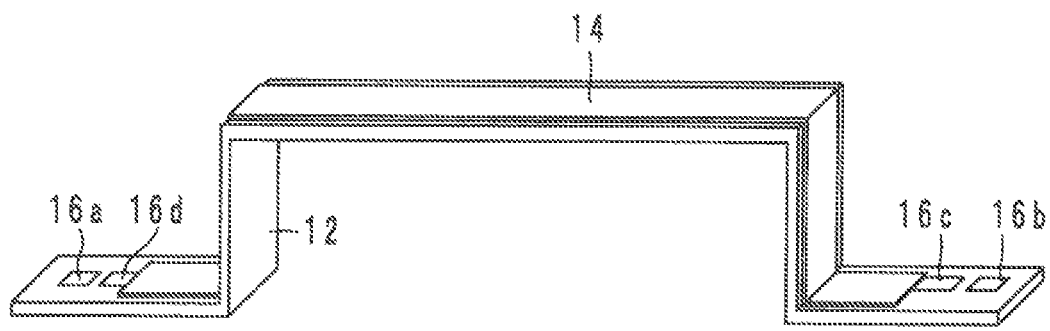
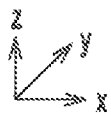

FIG. 11
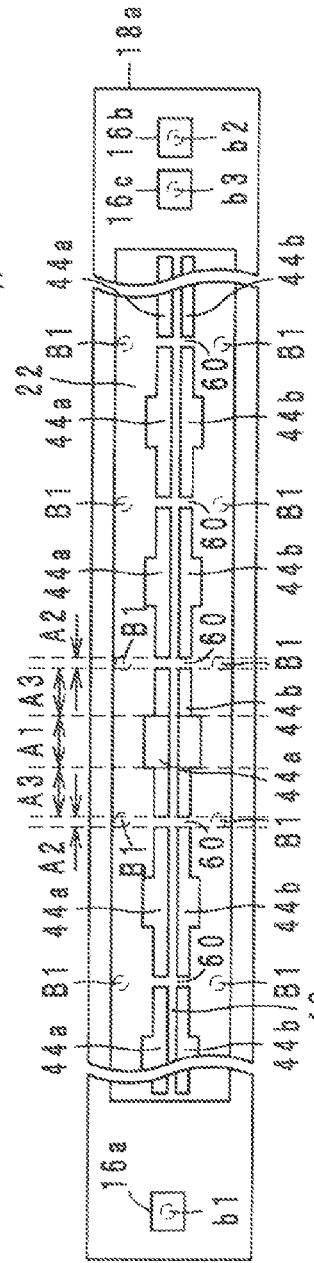
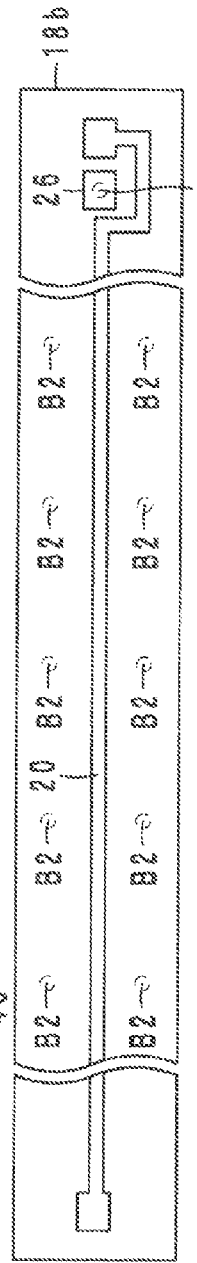
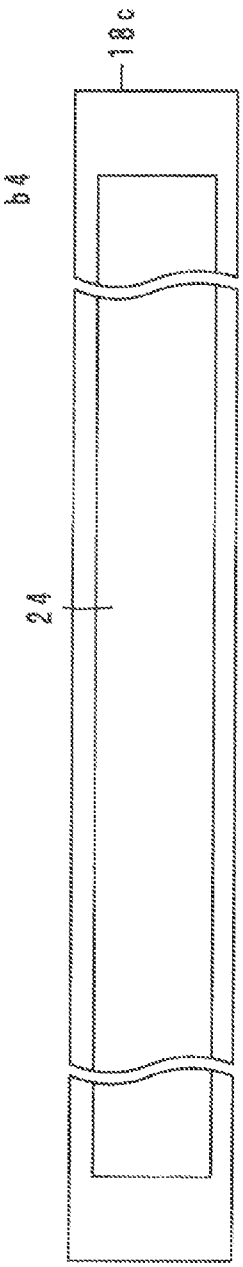

FIG. 13
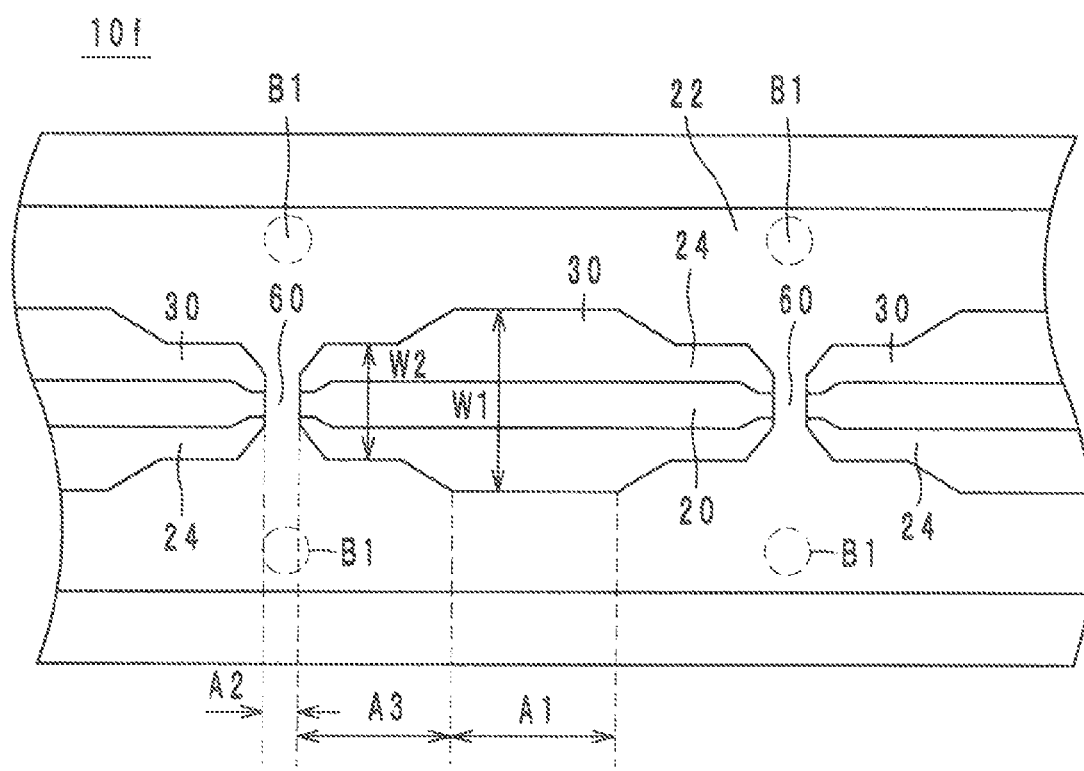

FIG. 15
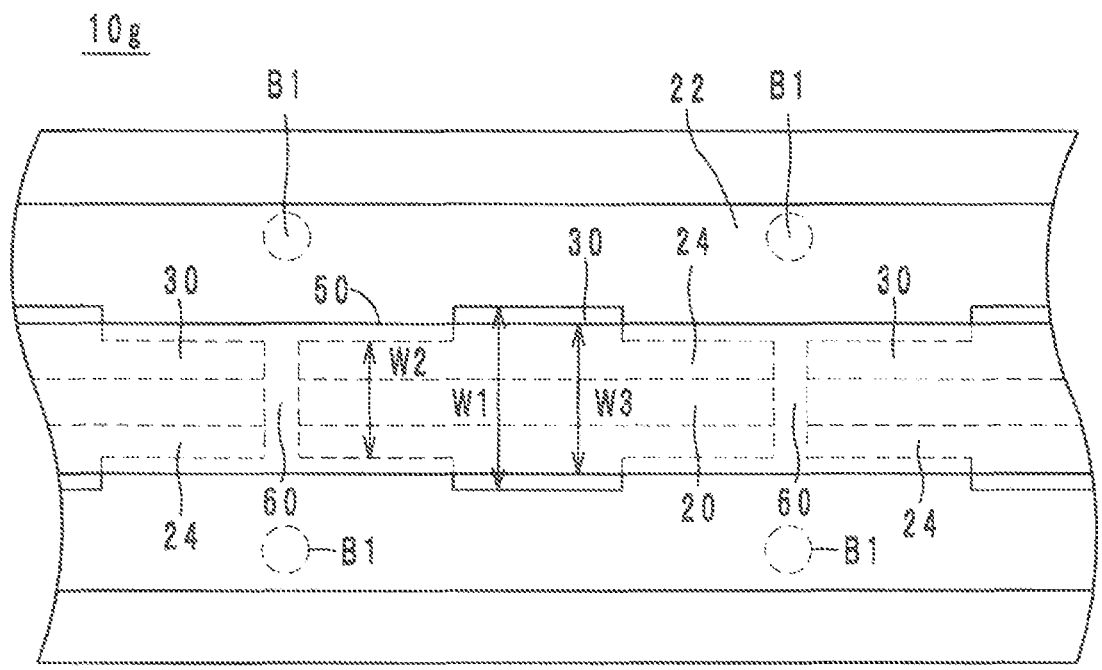

HIGH-FREQUENCY SIGNAL TRANSMISSION LINE

BACKGROUND OF THE INVENTION

1. Field of the Invention

The present invention relates to a high-frequency signal transmission line, and more particularly to a thin flexible high-frequency signal transmission line.

2. Description of the Related Art

In a high-frequency signal transmission line of a tri-plate stripline structure wherein a signal line is sandwiched between an upper and a lower grounding conductor, one way of decreasing the resistance to high-frequency waves is to increase the width of the signal line. Specifically, by increasing the width of the signal line, the surface area of the signal line is increased, and accordingly, the areas of the grounding conductors opposed to the signal line are increased. Therefore, the resistance of the signal line to high-frequency waves can be reduced.

However, the increase in the areas of the grounding conductors opposed to the signal line caused by the increase in width of the signal line leads to an increase in capacitances among the signal line and the grounding conductors. Also, the increase in width of the signal line leads to a decrease in inductance of the signal line. Still in this state, in order to achieve predetermined characteristic impedance (for example, 50Ω) of the high-frequency signal transmission line, the distances among the signal line and the grounding conductors are increased so that the capacitances can be reduced. However, the increase in distances among the signal line and the grounding conductors leads to an increase in thickness of the high-frequency signal transmission line, which is an obstacle to achievement of a flexible high-frequency signal transmission line.

In order to avoid this problem, it is possible that the signal line is arranged so as not to be opposed to a grounding conductor. This arrangement is described referring to the drawings. FIG. 16A is a top view of a high-frequency signal transmission line 500, viewed from a lamination direction, and FIG. 16A shows that a signal line 502 is not covered by a grounding conductor 504. FIG. 16B is a cross-sectional view of the high-frequency signal transmission line 500.

The high-frequency signal transmission line 500 includes, as shown in FIGS. 16A and 16B, a signal line 502 and grounding conductors 504 and 506. The signal line 502 is a linear conductor. The grounding conductor 506 is located at a lower level than the signal line 502 with respect to the lamination direction and is opposed to the signal line 502 via a dielectric layer. The grounding conductor 504 is located at an upper level than the signal line 502 with respect to the lamination direction and has an opening. The signal line 502 is located within the opening when viewed from the top in the lamination direction.

In the high-frequency signal transmission line 500 shown in FIGS. 16A and 16B, the signal line 502 and the grounding conductor 504 are not overlaid with each other when viewed from the lamination direction. Therefore, the capacitance generated between the signal line 502 and the grounding conductor 504 in the high-frequency signal transmission line 500 is smaller than that generated between a signal line and a grounding conductor in a high-frequency signal transmission line wherein the signal line and the grounding conductor are opposed to each other. In the high-frequency signal transmission line 500, therefore, it is possible to shorten the distance between the signal line 502 and the grounding conductor 504. Consequently, the thickness of the high-frequency signal transmission line 500 can be decreased, and the high-frequency signal transmission line 500 can be made flexible so as to be usable while bent.

However, the high-frequency signal transmission line 500 has a problem in that unnecessary radiation from the signal line 502 occurs. The signal line 502 is not covered by the grounding conductor 504. For this reason, the electromagnetic field generated by a current flow in the signal line 502 is radiated outward from the high-frequency signal transmission line 500 through the opening, and unnecessary radiation occurs. Moreover, the signal current partly leaks out as unnecessary radiation, which causes another problem of an increase in insertion loss of the signal current in the high-frequency signal transmission line 500.

As a high-frequency signal transmission line suggested to solve the problems above, for example, a flexible board disclosed by Japanese Patent Laid-Open Publication No. 2007-123740 is known. FIG. 17 is a top view of the flexible board 600 described in Japanese Patent Laid-Open Publication No. 2007-123740, viewed from a lamination direction.

The flexible board 600 includes a signal line 602 and a grounding layer 604. The signal line 602 is a linear conductor. The grounding layer 604 is located at an upper level than the signal line 602 with respect to the lamination direction via a dielectric layer. Although not shown in FIG. 17, another grounding layer is located at a lower level than the signal line 602 with respect to the lamination direction. In the flexible board 600, a plurality of openings 606 are provided in the grounding layer 604. The openings 606 are rectangular and are aligned over the signal line 602 in the extending direction of the signal line 602. Therefore, as viewed from the top of the lamination direction, the signal line 602 is partly overlaid with the grounding layer 604. Thus, since the signal line 602 is partly covered by the grounding layer 604, the flexible board 600 reduces unnecessary radiation from the signal line 602.

With respect to the flexible board 600, however, there is still a problem in that it is difficult to suppress unnecessary radiation while maintaining flexibility and realizing predetermined characteristic impedance of the whole signal line 602. This problem is described in more detail below.

The signal line 602 has portions covered by the grounding layer 604 (covered by bridges 607) and portions exposed by the openings 606 that are arranged alternately in the extending direction thereof. In order to reduce unnecessary radiation from the signal line 602, it is necessary that the openings 606 have small dimensions X1 and Y, wherein X1 is a dimension in the extending direction of the signal line 602, and Y is a dimension in a direction perpendicular to the extending direction of the signal line 602. However, if the dimensions X1 and Y of the openings 606 are set smaller, these exposed portions of the signal line 602 will exhibit too small impedance, whereby the characteristic impedance of the whole signal line 602 will be small. On the other hand, if the dimension X1 is set larger to make the dimension X2 of the bridges 607 smaller, the characteristic impedance will be greater, but unnecessary radiation through the openings 606 will be increased. Even if only the dimension Y of the openings 606 is set larger, the characteristic impedance will be too small because the other grounding conductor is provided at a lower level than the signal line 602 in the lamination direction. Therefore, in order to avoid this, the thickness of the flexible board will need to be increased. Thus, it is necessary to design the dimensions X1, X2 and Y simultaneously so as to achieve predetermined characteristic impedance and to suppress unnecessary radiation.

From an industrial viewpoint, it is a preferable method to determine the dimension Y including an allowance to eliminate the possibility that the openings 606 may be displace from the signal line 602 due to lamination errors (for example, Y=the width of the signal line+200 µm) before determining the dimensions X1 and X2. However, actually, the dimension X2 depends on the limitation of industrial thin line processing technology and is determined to be, for example, 200 µm. Then, the minimum value for the dimension X1, which determines the characteristic impedance, is automatically determined. The minimum value for the dimension X1 corresponds to the wavelength of a signal with the highest frequency the signal line is transmittable, and accordingly, when the minimum value for the dimension X1 is large, it means that the signal line has a poor transmission characteristic. Instead, when the dimension X2 is determined before the dimensions X1 and Y, the openings 606 will be designed such that the dimension X1 will be greater than X2 and such that the dimension Y will be, for example, about 1 mm. In this case, the length of the diagonal line of each of the openings 606 determines the frequency characteristic of unnecessary radiation and the frequency characteristic of transmission loss of the signal line.

The width X2 of the bridges 607 of the grounding layer 604 is very small and for example, 100 µm, and the length Y (corresponding to the width of the openings 606) of the bridges is about 1 mm as mentioned above. In this case, inductance occurs at the bridges. By arranging the signal line 602 and the grounding layer 604 as close as possible to each other, the high-frequency signal transmission line can be made as flexible as possible. By narrowing the bridges, for example, by reducing the width X2 of the bridges 607 from 100 µm to 50 µm and further to 30 µm, the lamination of the signal line 602 and the grounding conductor 604 can be made thinner. However, the reduction in width X2 of the bridges 607 also makes the inductance occurring at the bridges 607 greater, thereby causing fluctuation of the grounding potential of the grounding conductor 604. That is, great inductance unnecessarily occurs between the signal line 602 and the bridges X2, which degrades the grounding effect of the grounding conductor 604. Thereby, great unnecessary radiation may occur, and the grounding current concentrates on the bridges 607, which may cause a great loss. In sum, the trouble is caused by two problems. One is as follows: since the bridges 607 are thin and narrow electrodes, a high-frequency current is generated in the center portion of each of the bridges 607 by electromagnetic coupling between each of the bridges 607 and the signal line 602, and due to the high-frequency current, inductance unnecessarily occurs. The other is as follows: the unnecessary inductance is magnetically coupled with inductance that occurs due to a current flow in the signal line 602, which further causes mutual inductance, thereby making the unnecessary inductance at the bridges 607 greater.

SUMMARY OF THE INVENTION

Preferred embodiments of the present invention provide a thin high-frequency signal transmission line that has reduced unnecessary radiation and reduced transmission loss.

A high-frequency signal transmission line according to a preferred embodiment of the present invention includes a dielectric body including laminated dielectric layers; a signal line provided in the dielectric body; and a first grounding conductor arranged in the dielectric body so as to be opposed to the signal line via one of the dielectric layers, the first grounding conductor being of a ladder structure including openings and bridges alternately arranged in an extending direction of the signal line, wherein the signal line has a characteristic impedance that changes between two adjacent bridges such that the characteristic impedance rises from a minimum value to a first intermediate value and to a maximum value and falls from the maximum value to a second intermediate value and to the minimum value in this order.

A high-frequency signal transmission line according to a preferred embodiment of the present invention is thin but has reduced unnecessary radiation. Further, the high-frequency signal transmission line has a reduced loss in transmitting a high-frequency signal at predetermined impedance.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective outline view of a high-frequency signal transmission line according to a preferred embodiment of the present invention.

FIG. 11 is an exploded view of a high-frequency signal transmission line according to a sixth preferred embodiment of the present invention.

FIG. 13 is a transparent view of the high-frequency signal transmission line shown in FIG. 12, viewed from the top of a lamination direction.

FIG. 15 is a transparent view of the high-frequency signal transmission line shown in FIG. 14, viewed from the top of a lamination direction.

DETAILED DESCRIPTION OF THE PREFERRED EMBODIMENTS

High-frequency signal transmission lines according to preferred embodiments of the present invention will be described with reference to the drawings.

First Preferred Embodiment

Figure 2:
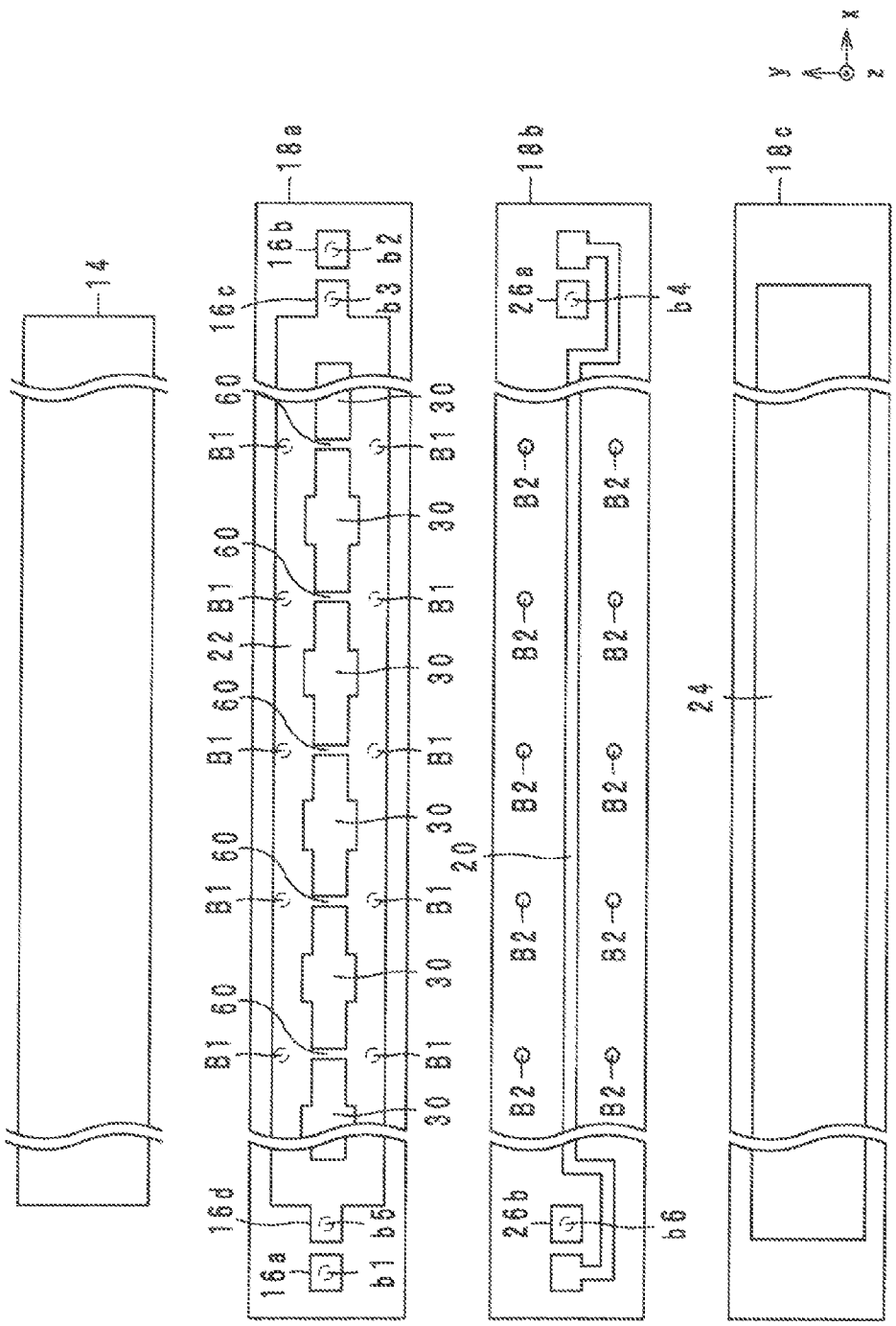
FIG. 2 is an exploded view of the high-frequency signal transmission line.
Figure 3:
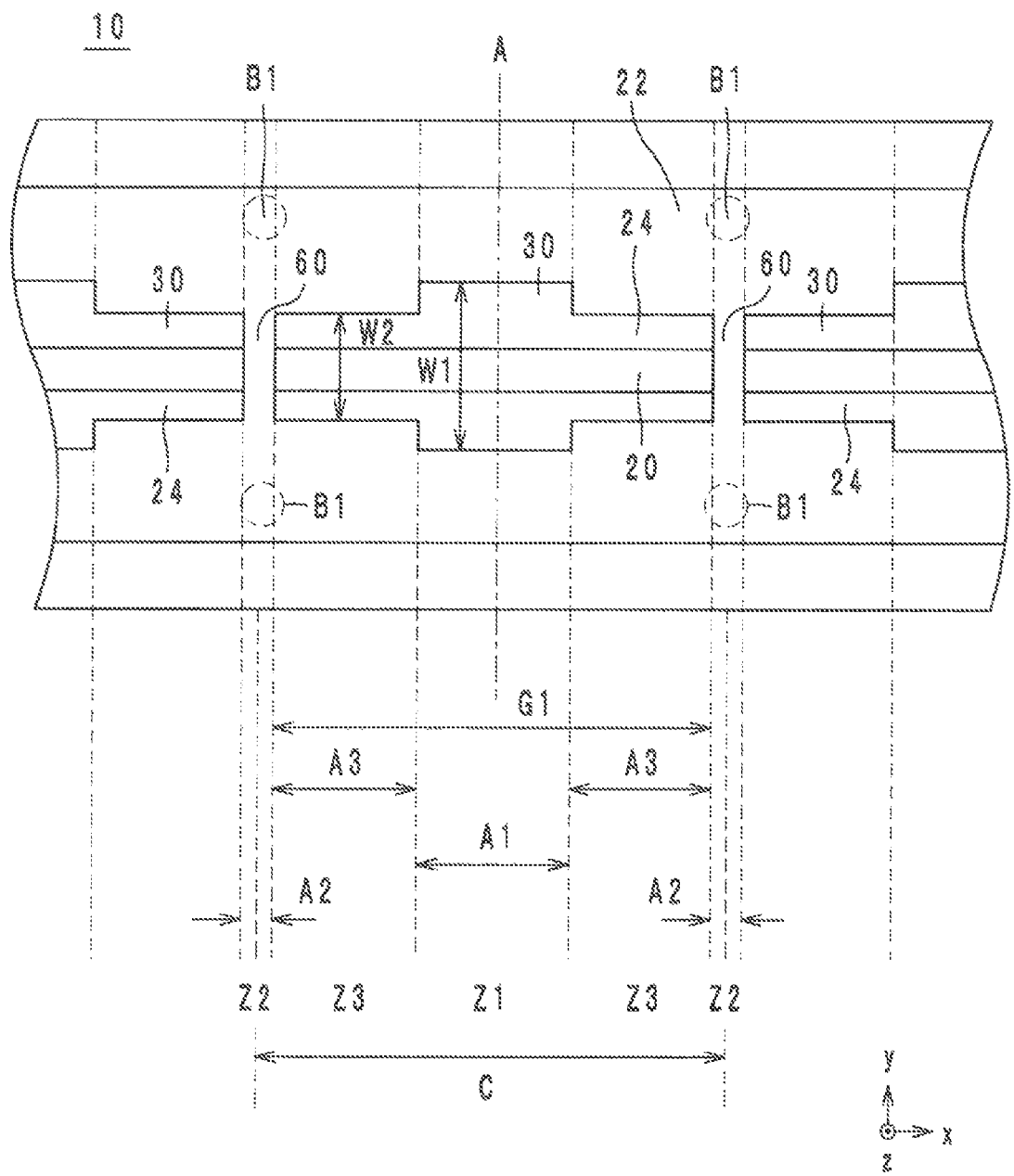
FIG. 3 is a transparent view of the high-frequency signal transmission line, viewed from the top of a lamination direction.
Figure 4:
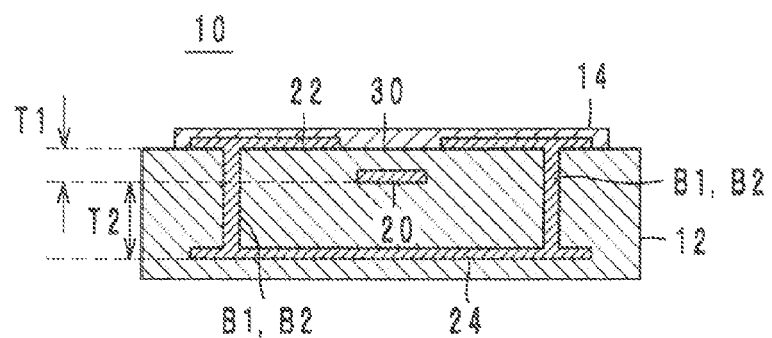
FIG. 4 is a cross-sectional view of high-frequency signal transmission line.
Figure 5:
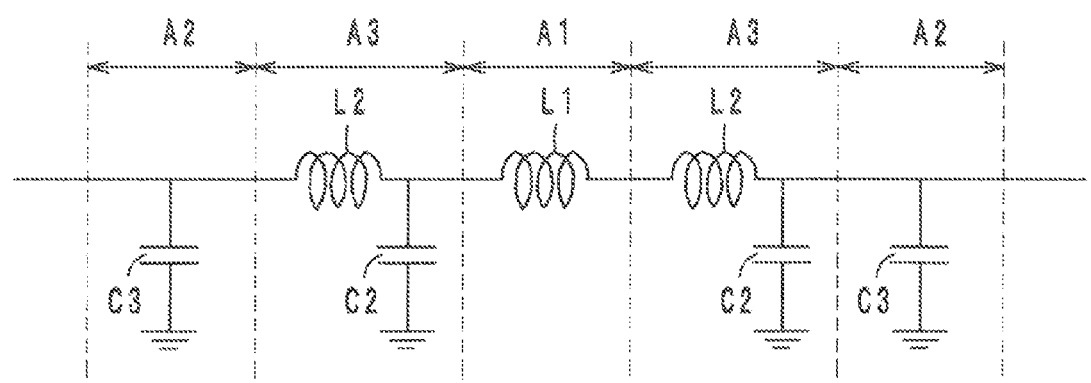
FIG. 5 is an equivalent circuit diagram of a portion of the high-frequency signal transmission line.

The structure of a high-frequency signal transmission line according to a first preferred embodiment is hereinafter described with reference to the drawings. FIG. 1 is a perspective outline view of the high-frequency signal transmission line 10 according to the first preferred embodiment of the present invention. FIG. 2 is an exploded view of the high-frequency signal transmission line 10. FIG. 3 is a transparent view of the high-frequency signal transmission line 10, viewed from the top of a lamination direction. FIG. 4 is a cross-sectional view of the high-frequency signal transmission line 10. FIG. 5 is an equivalent circuit diagram of a portion of the high-frequency signal transmission line 10. In FIGS. 1 to 4, the lamination direction of the high-frequency signal transmission line 10 is defined as a z-axis. The longitudinal direction of the high-frequency signal transmission line 10 is defined as an x-axis, and the direction perpendicular to the x-axis and the z-axis is defined as a y-axis.

The high-frequency signal transmission line 10 preferably is used, for example, in an electronic device such as a mobile phone to connect two high-frequency circuits to each other. As shown in FIGS. 1 and 2, the high-frequency signal transmission line 10 preferably includes a dielectric body 12, a protector 14, relay terminals 16 (16a to 16d), a signal line 20, grounding conductors 22 and 24, connection conductors 26 (26a and 26b), and via-hole conductors b1 to b6, B1 and B2.

The dielectric body 12 preferably is rectangular or substantially rectangular and extends in the x-axis when viewed along the z-axis. As shown by FIG. 2, the dielectric body 12 preferably includes dielectric sheets 18 (18a to 18c) that are laminated in the z-axis from a positive side to a negative side in this order.

The dielectric sheets 18 preferably are rectangular or substantially rectangular and extend along the x-axis when viewed along the z-axis. The dielectric sheets 18 preferably are made of flexible thermoplastic resin, such as polyimide and liquid-crystal polymer, etc. As shown in FIG. 4, the thickness T1 of the dielectric sheet 18a is smaller than the thickness T2 of the dielectric sheet 18b. The thickness T1 after lamination of the dielectric sheets 18a to 18c may be about 10 μm to about 100 μm, for example. In this preferred embodiment, the thickness T1 preferably is about 50 μm, for example. The thickness T2 after lamination of the dielectric sheets 18a to 18c may be about 50 μm to about 300 μm, for example. In this preferred embodiment, the thickness T2 is about 150 μm, for example. In the following description, main surfaces of the respective dielectric sheets 18 in the positive side along the z-axis are referred to as front surfaces, and main surfaces of the dielectric sheets 18 in the negative side along the z-axis are referred to as back surfaces.

As shown in FIG. 1, the relay terminal 16a is a rectangular conductor that is provided on the z-axis positive-side main surface of the dielectric body 12, in a negative-side end portion along the x-axis. That is, the relay terminal 16a is provided on the front surface of the dielectric sheet 18a, in the negative-side end portion along the x-axis.

The relay terminal 16b is a rectangular conductor that is provided on the z-axis positive-side main surface of the dielectric body 12, in a positive-side end portion along the x-axis. That is, the relay terminal 16b is provided on the front surface of the dielectric sheet 18a, in the positive-side end portion along the x-axis.

The relay terminal 16c is a rectangular conductor that is provided on the z-axis positive-side main surface of the dielectric body 12, in the positive-side end portion along the x-axis. That is, the relay terminal 16c is provided on the front surface of the dielectric sheet 18a, in the positive-side end portion along the x-axis. The relay terminal 16c is, as shown in FIGS. 1 and 2, located in the negative side of the relay terminal 16b along the x-axis.

The relay terminal 16d is a rectangular conductor that is provided on the z-axis positive-side main surface of the dielectric body 12, in the negative-side end portion along the x-axis. That is, the relay terminal 16d is provided on the front surface of the dielectric sheet 18a, in the negative-side end portion along the x-axis. The relay terminal 16d is, as shown in FIGS. 1 and 2, located in the positive side of the relay terminal 16b along the x-axis.

The relay terminals 16a to 16d are made of a metal with low specific resistance that contains silver or copper as a base, and are preferably made of a metal foil. Further, some of the relay terminals 16 (16a to 16d) may be provided on the z-axis negative-side main surface (on the back surface) of the dielectric body 12. The relay terminals 16 is preferably provided on (either one or both of) the main surfaces with which external connection is desired.

As shown in FIG. 2, the connection conductor 26a is a rectangular conductor that is provided on the z-axis positive-side main surface of the dielectric sheet 18b, in the positive-side end portion along the x-axis. The connection conductor 26a is located over the relay terminal 16c when viewed along the z-axis. The connection conductor 26a is made of a metal with low specific resistance that contains silver or copper as a base, and is preferably made of a metal foil.

The connection conductor 26b is a rectangular conductor that is provided on the z-axis positive-side main surface of the dielectric sheet 18b, in the negative end portion along the x-axis. The connection conductor 26b is located over the relay terminal 16d when viewed along the z-axis. The connection conductor 26b is made of a metal with low specific resistance that contains silver or copper as a base, and is preferably made of a metal foil.

As shown in FIG. 2, the signal line 20 is a linear conductor that is provided inside of the dielectric body 12, and specifically, the signal line 20 extends along the x-axis on the front surface of the dielectric sheet 18b. The signal line 20, however, circumvents the connection conductors 26a and 26b so as not to come into contact with the connection conductors 26a and 26b. Both ends of the signal line 20 are located over the relay terminals 16a and 16b, respectively, when viewed along the z-axis. The width of the signal line 20 may be, for example, about 100 μm to about 500 μm. In this preferred embodiment, the width of the signal line 20 preferably is about 240 μm, for example. The signal line 20 is made of a metal with low specific resistance that contains silver or copper as a base, and is preferably made of a metal foil.

As shown in FIG. 2, the grounding conductor (first grounding conductor) 22 is provided inside of the dielectric body 12 and located in the positive side of the signal line 20 along the z-axis. Specifically, the grounding conductor 22 is provided on the front surface of the dielectric sheet 18a. The grounding conductor 22 is a rectangular conductor that extends along the x-axis on the front surface of the dielectric sheet 18a, and the grounding conductor 22 is opposed to the signal line 20 via the dielectric sheet 18a. The grounding conductor 22 is connected to the relay terminals 16c and 16d. The grounding conductor 22 is made of a metal with low specific resistance that contains silver or copper as a base, and is preferably made of a metal foil.

Also, the grounding conductor 22 is ladder-structured. More specifically, in the grounding conductor 22, openings 30, which are non-conductive portions, and bridges 60, which are conductive portions, are arranged alternately along the signal line 20. As shown in FIG. 3, the openings 30 are formed over the signal line 20 when viewed along the z-axis, and each of the openings 30 has a shape that is symmetrical with respect to the signal line 20. That is, the signal line 20 crosses the y-axis centers of the openings 30.

Further, each of the openings 30 is symmetrical with respect to a line A passing the x-axis center of each opening 30 and extending in a direction perpendicular to the signal line 20 (that is, extending along the y-axis). A detailed description of the openings 30 will be given below.

The high-frequency signal transmission line 10 is divided into areas A1, A2 and A3 along the x-axis. The area A1 is an area including the x-axis central portion of each opening 30. The area A2 is an area including each bridge 60. The area A 3 is an area between the area A1 and the area A2. There are areas A3 in both sides of each area A1, and each of the areas A3 borders an area A1 and an area A2. The x-axis dimension of the area A2, which is equal to the x-axis dimension of each bridge 60, may be, for example, about 25 µm to about 200 µm. In this preferred embodiment, the x-axis dimension of the area A2 preferably is about 100 µm.

As shown in FIG. 3, the line A passes the x-axis center of the area A1. In the area A1, the opening 30 has a dimension in a direction perpendicular to the signal line 20 (a y-axis dimension or a width) W1, and in the areas A3, the opening 30 has a y-axis dimension (a width) W2. The width W1 is greater than the width W2. Thus, the opening 30 is of such a symmetrical shape with respect to the line A that the x-axis central portion has a greater width than x-axis peripheral portions. In this preferred embodiment, the area where the opening 30 has the y-axis dimension (width) W1 is the area A1, and the areas where the opening 30 has the y-axis dimension (width) is W2 are the areas A3. Accordingly, the opening 30 has rectangular bends among the areas A1 and A3. The width W1 may be, for example, about 500 µm to about 1500 µm. In this preferred embodiment, the width W1 preferably is about 900 µm, for example. The width W2 is, for example, 250 µm to 750 µm. In this preferred embodiment, the width W2 preferably is about 480 µm, for example.

The x-axis dimension (length) G1 of the opening 30 may be, for example, about 1mm to about 5 mm. In this preferred embodiment, the length G1 preferably is about 3 mm, for example. The length G1 of the opening 30 is longer than the maximum width W1 of the opening 30. Further, it is preferred that the length G1 is equal to or greater than twice the width W1.

In the grounding conductor 22, no other openings are made among the openings 30. More specifically, a conductive layer evenly spreads over the area A2 between adjacent openings 30, and no openings are present in the areas A2.

As shown in FIG. 2, the grounding conductor 24 (the second grounding conductor) is provided inside of the dielectric body 12 and is located in the negative side of the signal line 20 along the z-axis. More specifically, the grounding conductor 24 is provided on the front surface of the dielectric sheet 18c. The grounding conductor 24 is a rectangular conductor that extends along the x-axis to spread evenly over the front surface of the dielectric sheet 18c. The grounding conductor 24 is opposed to the signal line 20 via the dielectric sheet 18b. However, the grounding conductor 22 is not necessarily required to completely cover the signal line 20, and for example, minute openings may be provided in the grounding conductor 22 at specified points so that gases generated by thermocompression bonding of the thermoplastic resin material of the dielectric sheets 18 can be evacuated. The grounding conductor 24 preferably is made of a metal with low specific resistance that contains silver or copper as a base, and is preferably made of a metal foil, for example.

As described above, the signal line 20 is sandwiched between the grounding conductors 22 and 24 along the z-axis. Thus, the signal line 20 and the grounding conductors 22 and 24 define a tri-plate stripline structure. The interval between the signal line 20 and the grounding conductor 22 is substantially equal to the thickness T1 of the dielectric sheet 18a (see FIG. 4) and may be, for example, about 10 µm to about 100 µm. In this preferred embodiment, the interval between the signal line 20 and the grounding conductor 22 preferably is about 50 µm, for example. The interval between the signal line 20 and the grounding conductor 24 is substantially equal to the thickness T2 of the dielectric sheet 18b (see FIG. 4) and may be, for example, about 50 µm to about 300 µm, for example. In this preferred embodiment, the interval between the signal line 20 and the grounding conductor 24 preferably is about 150 µm, for example. Thus, the thickness T2 is greater than the thickness T1. In other words, the signal line 20 is located in a position to be closer to the grounding conductor 22 than to the grounding conductor 24.

The via-hole conductor b1 penetrates through the dielectric sheet 18a along the z-axis and connects the relay terminal 16a to the x-axis negative end of the signal line 20. The via-hole conductor b2 penetrates through the dielectric sheet 18a along the z-axis and connects the relay terminal 16b to the x-axis positive end of the signal line 20. Thereby, the signal line 20 is connected between the relay terminals 16a and 16b.

The via-hole conductor b3 penetrates through the dielectric sheet 18a along the z-axis and connects the relay terminal 16c to the connection conductor 26a. The via-hole conductor b4 penetrates through the dielectric sheet 18b along the z-axis and connects the connection conductor 26a to the grounding conductor 24. As a result, the grounding conductor 24 is connected to the relay terminal 16c via the via-hole conductors b3 and b4 and the connection conductor 26a.

The via-hole conductor b5 penetrates through the dielectric sheet 18a along the z-axis and connects the relay terminal 16d to the connection conductor 26b. The via-hole conductor b6 penetrates through the dielectric sheet 18b along the z-axis and connects the connection conductor 26b to the grounding conductor 24. As a result, the grounding conductor 24 is connected to the relay terminal 16d via the via-hole conductors b5 and b6 and the connection conductor 26b. The via-hole conductors b1 to b5 preferably are made of a metal with low specific resistance that contains silver or copper as a base, and are preferably made of a metal foil, for example.

Plural via-hole conductors B1 and plural via-hole conductors B2 are provided for the dielectric sheets 18a and 18b, respectively. The via-hole conductors B1 and B2 penetrate through the dielectric sheets 18a and 18b, respectively, along the z-axis. The respective via-hole conductors B1 are connected to the respective via-hole conductors B2 such that each connected pair of conductors B1 and B2 define one via-hole conductor for connecting the grounding conductors 22 and 24 to each other. Consequently, the grounding conductor 22 is connected to the relay terminals 16c and 16d via the via-hole conductors B1 and B2, the grounding conductor 24, the via-hole conductors b3, b4, b5 and b6, and the connection conductors 26a and 26b.

As shown in FIG. 3, the via-hole conductors B1 and B2 are arranged such that two via-hole conductors penetrating through the dielectric sheets 18a and 18b are provided in each area A2. It should be noted that although it appears in FIG. 3 that the via-hole conductors B1 and B2 extend a little beyond the area A2 and into the area A3, the centers of the via-hole conductors B1 and B2 are located within the area A2. The via-hole conductors B1 and B2 are not sandwiched between adjacent openings 30. Specifically, the via-hole conductors B1 and B2 are located in the positive side and in the negative side of the openings 30 along the y-axis. The via-hole conductors B1 and B2 are preferably made of a metal with low specific resistance that contains silver or copper as a base, for example.

The protector 14 is provided over the front surface of the dielectric sheet 18a to cover the grounding conductor 22. The protector 14 is preferably made of, for example, flexible resin such as a resist material.

In the high-frequency signal transmission line 10 of the above-described structure, the characteristic impedance of the signal line 20 changes depending on the portion relative to the locations of the bridges 60. Specifically, between two adjacent bridges 60, when going farther from one bridge 60 and closer to the other bridge 60, the characteristic impedance rises from a minimum value Z2 to an intermediate value Z3 and further to a maximum value Z1 and falls from the maximum value Z1 to the intermediate value Z3 and then to the minimum value Z2. The reason is as follows. The opening 30 between two adjacent bridges 60 has the greater width W1 in the area A1 and has the smaller width W2 in the areas A3. Accordingly, the distance between the signal line 20 and the grounding conductor 22 in the area A1 is greater than the distance between the signal line 20 and the grounding conductor 22 in the areas A3. Therefore, the magnetic field strength acting on the signal line 20 in the area A1 is greater than the magnetic field strength acting on the signal line 20 in the areas A3, and the inductance in the area A1 is greater than the inductance in the areas A3. Thus, in the area A1, the inductance effect is dominant.

The bridges 60 are present in the areas A2. Accordingly, the distance between the signal line 20 and the grounding conductor 22 in the areas A3 is greater than the distance between the signal line 20 and the grounding conductor 22 in the areas A2. Therefore, the capacitance of the signal line 20 in the areas A2 is greater than the capacitance of the signal line 20 in the areas A3, and the magnetic field strength acting on the signal line 20 in the areas A2 is smaller than the magnetic field strength acting on the signal line 20 in the areas A3. Thus, in the areas A2, the capacitance effect is dominant.

For the reasons above, the characteristic impedance of the signal line 20 exhibits the maximum value Z1 in the area A1. In other words, the opening 30 has the width W1 in a position where the characteristic impedance of the signal line 20 exhibits the maximum value Z1. Also, the characteristic impedance of the signal line 20 exhibits the intermediate value Z3 in the areas A3. In other words, the opening 30 has the width W2 in a position where the characteristic impedance of the signal line 20 exhibits the intermediate value Z3. Further, the characteristic impedance of the signal line 20 exhibits the minimum value Z2 in the areas A2.

Thus, the high-frequency signal transmission line 10 has a circuit configuration shown by FIG. 5. Specifically, in the area A1, since almost no capacitance occurs between the signal line 20 and the grounding conductor 22, the characteristic impedance Z1 of the signal line 20 mostly depends on the inductance L1 of the signal line 20. In the areas A2, since great capacitance C3 occurs between the signal line 20 and the grounding conductor 22, the characteristic impedance Z2 of the signal line 20 mostly depends on the capacitance C3. In the areas A3, since capacitance C2 smaller than the capacitance C3 occurs between the signal line 20 and the grounding conductor 22, the characteristic impedance Z3 of the signal line 20 depends on the inductance L2 of the signal line 20 and the capacitance C2. The characteristic impedance Z3 is, for example, about 55Ω. The characteristic impedance Z1 preferably is higher than the characteristic impedance Z3 and, for example, about 70Ω. The characteristic impedance Z2 is lower than the characteristic impedance Z3 and, for example, about 30Ω. The characteristic impedance of the high-frequency signal transmission line 10, in whole, preferably is about 50Ω, for example.

Next, the usage of the high-frequency signal transmission line 10 is described. The high-frequency signal transmission line 10 is fitted into an electronic device while bent as shown in FIG. 1, and the high-frequency signal transmission line 10 is to connect a first high-frequency circuit and a second high-frequency circuit that are incorporated in the electronic device to each other. For example, the first high-frequency circuit is an antenna element, and the second high-frequency circuit is a feed circuit. The x-axis negative-side end portion of the high-frequency signal transmission line 10 is connected to a connector of a board supporting the first high-frequency circuit (a first circuit board). In this moment, the relay terminal 16a contacts with a signal terminal provided in the connector of the first circuit board, and the relay terminal 16d contacts with a grounding terminal provided in the connector of the first circuit board. Also, the x-axis positive-side end portion of the high-frequency signal transmission line 10 is connected to a connector of aboard supporting the second high-frequency circuit (a second circuit board). In this moment, the relay terminal 16b contacts with a signal terminal provided in the connector of the second circuit board, and the relay terminal 16c contacts with a grounding terminal provided in the connector of the second circuit board. Thereby, the grounding potential is applied to the relay terminals 16c and 16d, and a high-frequency signal (for example, a signal of 2 GHz) is sent to the relay terminal 16a and 16b.

A production method of the high-frequency signal transmission line 10 will be hereinafter described with reference to FIG. 2. In the following, a production method of one high-frequency signal transmission line 10 will be described. Practically, however, large-size dielectric sheets are laminated and cut, whereby plural high-frequency signal transmission lines 10 are produced at a time.

First, copper foils are provided entirely on the respective front surfaces of thermoplastic resin sheets used as the dielectric sheets 18 (18a to 18c). The surfaces of the copper foils on the front surfaces of the dielectric sheets 18 are galvanized for corrosion proof, and thereby, the surfaces of the copper foils are smoothed. The dielectric sheets 18 preferably are liquid crystal polymer and have thicknesses of about 20 μm to about 80 μm, for example. The thicknesses of the copper foils preferably are 10 μm to 20 μm, for example.

Next, the relay terminals 16 and the grounding conductor 22 are formed on the front surface of the dielectric sheet 18a as shown in FIG. 2 by photolithography. Specifically, a resist having a pattern of the relay terminals 16 and the grounding conductor 22 shown in FIG. 2 is printed on the copper foil on the dielectric sheet 18a. Next, etching is applied to the copper foil so as to remove the copper foil except for the portion covered by the resist. Thereafter, the resist is removed. In this way, the relay terminals 16 and the grounding conductor 22 are formed on the front surface of the dielectric sheet 18a as shown in FIG. 2.

Next, the signal line 20 and the connection conductors 26 are formed on the front surface of the dielectric sheet 18b as shown in FIG. 2 by photolithography. Also, the grounding conductor 24 is formed on the front surface of the dielectric sheet 18c as shown in FIG. 2 by photolithography. The photolithography to form the signal line 20 and the connection conductors 26 and the photolithography to form the grounding conductor 24 are the same as the photolithography to form the relay terminals 16 and the grounding conductor 22, and a description thereof is omitted.

Next, the positions of the dielectric sheets 18a and 18b where the via-hole conductors b1 to b6, B1 and B2 are to be formed are irradiated with a laser beam from the back surfaces of the dielectric sheets 18a and 18b, whereby via holes are formed at the positions. Then, conductive paste is filled in the via holes formed in the dielectric sheets 18a and 18b.

Next, the dielectric sheets 18a to 18c are laminated in this order from the positive side to the negative side along the z-axis such that the grounding conductor 22, the signal line 20 and the grounding conductor 24 define a stripline structure. Heat and pressure are applied to the laminated dielectric sheets 18a to 18c from the positive side and the negative side along the z-axis. Thereby, the dielectric sheets 18a to 18c are softened and integrated, and the conductive paste filled in the via holes is hardened to become the via-hole conductors b1 to b6, B1 and B2. Instead of applying heat and pressure to the dielectric sheets 18, an adhesive such as epoxy resin may be used to bond the dielectric sheets 18 together. Also, the via-hole conductors b1 to b6, B1 and B2 may be formed after the integration of the dielectric sheets 18 by making via holes in the integrated dielectric sheets 18 and by filling conductive paste in the via holes or plating the via holes.

At the end, resin paste is coated on the dielectric sheet 18a to form the protector 14. In this way, a high-frequency signal transmission line 10 as shown by FIG. 1 is produced.

In the high-frequency signal transmission line 10, between two adjacent bridges 60, when going farther from one bridge 60 and closer to the other bridge 60, the characteristic impedance rises from the minimum value Z2 to the intermediate value Z3 and further to the maximum value Z1 and falls from the maximum value Z1 to the intermediate value Z3 and then to the minimum value Z2. Hence, the high-frequency signal transmission line 10 can be made thinner. Moreover, although the high-frequency signal transmission line 10 is thin, the width of the signal line 20 can be made wider, and accordingly, the surface areas of electrode regions of the signal line 20 and the grounding conductors 22 and 24 in which a high-frequency current flows can be enlarged, which results in a reduced transmission loss of the high-frequency signal. Also, as shown in FIG. 3, since the cycle length C (from the center of an area A2 to the center of the next area A2 through one area A1 and two areas A3) is short (e.g., about 1mm to about 5 mm), even in a higher-frequency area, unnecessary radiation and transmission loss can be sufficiently reduced and prevented. The areas A3 located in both sides of the area A1 prevents direct transmission of the strong magnetic field caused by the current flow in the signal line 20 to the areas A2. Thereby, the grounding potential in the areas A2 is stable, and the shielding effectiveness of the grounding conductor 22 holds. Hence, unnecessary radiation can be prevented. Thus, in the structure of the high-frequency signal transmission line 10, even when the distances among the signal line 20 and the grounding conductors 22 and 24 are made smaller, the width of the signal line 20 can be made greater. Accordingly, a thin high-frequency signal transmission line 10 having desired characteristic impedance, reduced transmission loss and reduced unnecessary radiation can be obtained. Thereby, the high-frequency signal transmission line 10 bends readily, and the high-frequency signal transmission line 10 can be used while bent.

Figure 17:
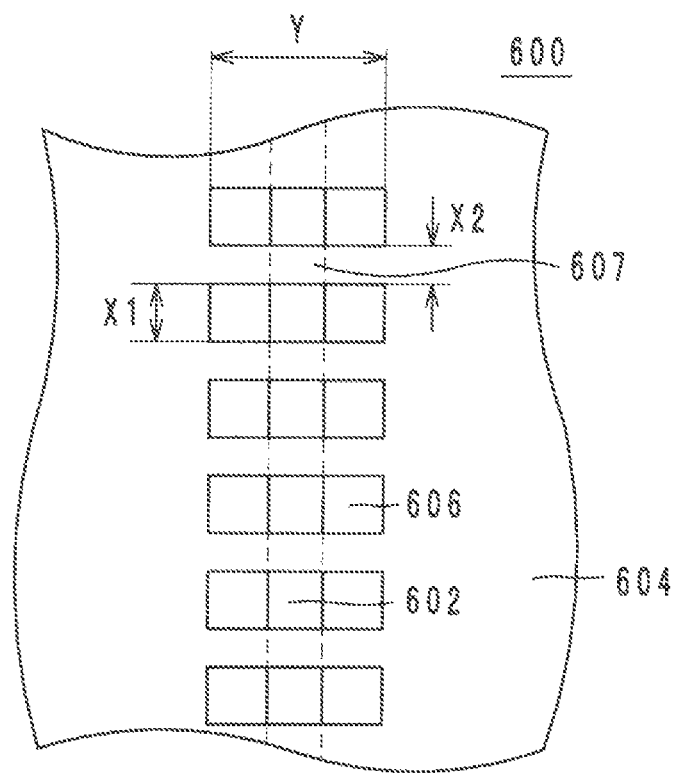
FIG. 17 is a top view of a flexible board disclosed by Japanese Patent Laid-Open Publication No. 2007-123740, viewed from a lamination direction.

The high-frequency signal transmission line 10 has the advantage of reduced transmission loss and improved shielding effectiveness due to stability of the grounding potential on the grounding conductor 22. In a transmission line of a stripline structure, a high-frequency current in a signal line and a high-frequency current in a grounding line flow in mutually opposite directions instantaneously. In order to reduce the transmission loss of the whole transmission line, it is necessary to lower both the high-frequency resistance of the signal line and the high-frequency resistance of the grounding line. As shown in FIG. 17, when bridges 607 of a grounding layer 604 have a reduced width X2, inductance unnecessarily occurs at the bridges 607, and the high-frequency resistance of the grounding layer 604 becomes greater. In this case, moreover, since mutual inductance is caused by magnetic field coupling between the bridges 607 and the signal line 602 (more specifically, magnetic coupling between the inductance unnecessarily occurring at the bridges 607 and the inductance of the signal line 602), the unnecessary inductance at the bridges 607 appears to be even greater.

In the flexible board 600 shown by FIG. 17, the signal line 604 includes portions covered by the grounding layer 604 and portions exposed by the openings 606 provided in the grounding layer 604, and the covered portions and the exposed portions are arranged alternately. The magnetic energy on the exposed portions of the signal line 602 causes eddy currents in the other grounding layer at the portions opposed to the exposed portions of the signal line 602. Thus, the grounding potential on the grounding layer at the portions opposed to the exposed portions of the signal line 602 changes due to the magnetic field. For this reason, the grounding layer loses the shielding effectiveness at the portions opposed to the exposed portions of the signal line 602, and unnecessary radiation occurs therefrom. Thus, the signal line 602 has a transmission loss.

When only the width of the bridges 607 is reduced, great inductance unnecessarily occurs at the bridges 607. Accordingly, the grounding potential of the grounding layer 604 fluctuates, and the grounding layer 604 loses the shielding effectiveness. Therefore, unnecessary radiation occurs. As the width X2 of the bridges 607 decreases, the loss of shielding effectiveness and the occurrence of unnecessary radiation become more noticeable.

In the high-frequency signal transmission line 10 according to the present preferred embodiment, on the other hand, the width W1 of the opening 30 in the area A1 is greater than the width W2 of the opening 30 in the areas A3. Therefore, the magnetic energy on the signal line 20 in the area A1 is higher than the magnetic energy on the signal line 20 in the areas A3. Also, the magnetic energy on the signal line 20 in the areas A2 is lower than the magnetic energy on the signal line 20 in the areas A3. Accordingly, the characteristic impedance of the signal line 20 changes from Z2, Z3, Z1, Z3, Z2 . . . periodically. Thus, the change in the magnetic energy on the signal line 20 in the x-axis is gradual. At the borders among unit structures, the magnetic energy is small. Thereby, the grounding potential of the grounding conductor is prevented from fluctuating, and occurrence of unnecessary radiation and transmission loss of the high-frequency signal is significantly reduced and prevented. In other words, the presence of the areas A3 prevents unnecessary inductance at the bridges, which further significantly reduces and prevents mutual inductance between the bridges and the signal line and stabilizes the grounding potential. Hence, although the high-frequency signal transmission line 10 is thin and has relatively large openings in the grounding conductor, the high-frequency signal transmission line 10 has reduced unnecessary radiation and reduced transmission loss.

Further, by arranging the via-hole conductors B1 in positions extended from the bridges, occurrence of inductance at the bridges are further reduced and prevented. Especially by setting the x-axis dimension G1 of the openings 30 (the intervals among the bridges) to be longer than the width W1 of the openings 30 in the areas A1, it becomes possible that the openings 30 have greater areas, which enables achievement of desired characteristic impedance and prevention of unnecessary radiation.

The openings 30 are arranged periodically in the extending direction of the signal line 20 (in the x-axis), and each of the openings 30 is a unit structure of the periodical structure. Therefore, the frequency characteristic of the characteristic impedance of the signal line 20 within each of the openings 30 is determined by the x-axis dimension of the openings 30. Specifically, when the x-axis dimension G1 of the openings 30 is set to be shorter, the signal line 20 has characteristic impedance with such a frequency characteristic to permit transmission of signals in a higher frequency range. On the other hand, when the x-axis dimension G1 of the openings 30 is set to be longer, the width W1 of the areas A1 can be set smaller, that is, the openings 30 can be made narrower. In this case, unnecessary radiation can be further reduced and prevented, and accordingly, transmission loss can be further prevented. Thus, by setting the x-axis dimension G1 of the openings 30 appropriately, a high-frequency signal transmission line that can perform stable transmission of signals in a broader frequency range while having reduced unnecessary radiation and reduced transmission loss can be obtained.

Also, for the reason below, the high-frequency signal transmission line 10 can be used while bent. In the high-frequency signal transmission line 10, the openings 30 have the maximum y-axis dimension in the areas A1, and accordingly, the high-frequency signal transmission line 10 most easily bends at the areas A1. On the contrary, since the openings 30 are not provided in the areas A2, the high-frequency signal transmission line 10 most hardly bends at the areas A2. Accordingly, when the high-frequency signal transmission line 10 is used while bent, the high-frequency signal transmission line 10 is bent at the areas A1 and is hardly bent at the areas A2. For this reason, the via-hole conductors B1 and B2, which are less flexible than the dielectric sheets 18, are located at the areas A2. Thus, it is possible to bend the high-frequency signal transmission line 10 easily at the areas A1.

In the high-frequency signal transmission line 10, also by adjusting the distance T1 between the signal line 20 and the grounding conductor 22 and the distance T2 between the signal line 20 and the grounding conductor 24, it is possible to achieve desired characteristic impedance.

Further, for the reason below, the x-axis dimension G1 of the openings 30 is greater than the maximum y-axis dimension W1 of the openings 30. The high-frequency signal transmission mode of the high-frequency signal transmission line 10 is a TEM mode. In the TEM mode, an electric field and a magnetic field occur in directions perpendicular to the signal transmission direction (x-axis). Specifically, the magnetic field occurs in a circular pattern from the signal line 20, and the electric field occurs radially from the signal line 20 to the grounding conductors 22 and 24. Since the magnetic field occurs in a circular pattern, the provisions of the openings 30 in the grounding conductors 22 only causes the circular magnetic field to have a little increased radius at each of the openings 30, and the magnetic field hardly leaks out from the high-frequency signal transmission line 10. On the other hand, due to the presence of the openings 30, the electric field partly leaks out from the high-frequency signal transmission line 10. Thus, unnecessary radiation from the high-frequency signal transmission line 10 is attributed mostly to the electric field emission.

The electric field is perpendicular to the signal transmission direction (x-axis). Therefore, the greater the y-axis dimension W1 of the openings 30, the greater the amount of the electric field emission through the openings 30, that is, the greater the unnecessary radiation. In the meantime, the greater the y-axis dimension W1 of the openings 30, the higher the characteristic impedance of the high-frequency signal transmission line 10. Further, the electric field strength becomes almost zero in a position located at a distance of three times the width of the signal line 20 from the signal line 20 in the direction perpendicular to the signal transmission direction (x-axis). Therefore, even if the y-axis dimension W1 of the openings 30 is increased from a value to make the distance between the grounding conductor 22 and the signal line 20 at the openings 30 equal to the distance where the electric field strength becomes zero, the increase in the y-axis dimension W1 of the openings 30 no longer contributes to increasing the characteristic impedance. Therefore, considering that an increase in the y-axis dimension W1 of the openings 30 causes an increase in the unnecessary radiation, it is not desirable to increase the y-axis dimension W1 of the openings 30 more than necessary. Moreover, when the y-axis dimension W1 of the openings 30 becomes almost a half wavelength of the high-frequency signal, the openings 30 function as a slot antenna to radiate electromagnetic waves, and in this case, unnecessary radiation further increases.

Also, the greater the x-axis dimension G1 of the openings 30, the smaller the area of the signal line 20 opposed to the grounding conductor 22. Accordingly, by increasing the x-axis dimension G1 of the openings 30, it becomes possible to widen the signal line 20, whereby the high-frequency resistance of the signal line 20 can be reduced.

When the x-axis dimension G1 of the openings 30 is greater than the y-axis dimension W1 of the openings 30, the high-frequency resistance of the counter electricity (eddy current) on the grounding conductor 22 can be reduced.

From the considerations above, it is preferred that the y-dimension G1 of the openings 30 is set greater than the x-dimension W1 of the openings 30, and more preferably, the x-axis dimension G1 is equal to or greater than twice the y-axis dimension W1. It is to be noted that when the x-axis dimension G1 of the openings 30 becomes almost a half wavelength of the high-frequency signal, the openings 30 function as a slot antenna to radiate electromagnetic waves, and therefore, the x-axis dimension G1 shall be sufficiently short relative to the wavelength of the high-frequency signal.

Second Preferred Embodiment

Figure 6:
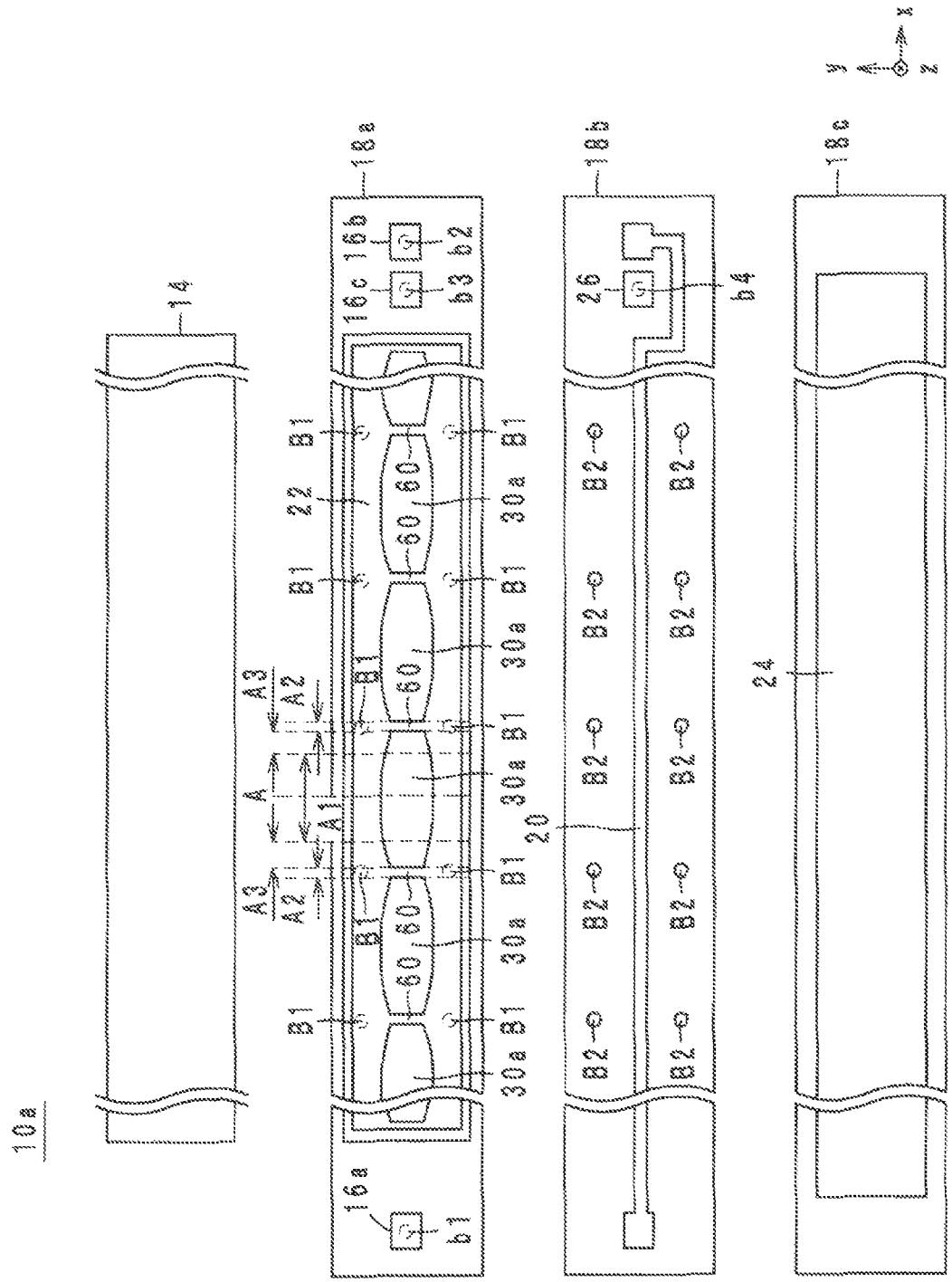
FIG. 6 is an exploded view of a high-frequency signal transmission line according to a second preferred embodiment of the present invention.
Figure 7:
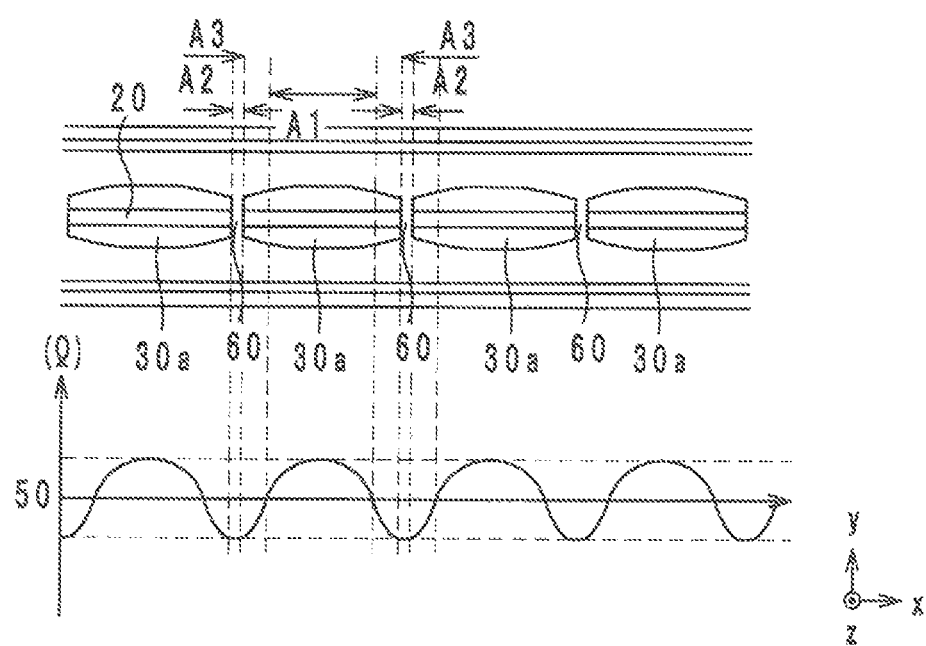
FIG. 7 is a graph showing impedance of a signal line of the high-frequency signal transmission line according to the second preferred embodiment of the present invention.

In the following, a high-frequency signal transmission line according to a second preferred embodiment will be described with reference to the drawings. FIG. 6 is an exploded view of the high-frequency signal transmission line 10a according to the second preferred embodiment. FIG. 7 is a graph showing the impedance of the signal line 20 of the high-frequency signal transmission line 10a according to the second preferred embodiment.

The high-frequency signal transmission line 10a is different from the high-frequency signal transmission line 10 in that openings 30a provided in the grounding conductor 22 in the high-frequency signal transmission line 10a are of a different shape from the openings 30. While the y-axis dimension of each of the openings 30 changes step by step as shown by FIG. 2, the y-axis dimension of each of the openings 30a changes continuously. More specifically, each of the openings 30a has a smaller y-axis dimension the farther its location from the x-axis center of the opening 30a, and the decrease in the y-axis dimension of the opening 30a is continuous. Thereby, as shown by FIG. 7, the magnetic field energy and the characteristic impedance of the signal line 20 change periodically and continuously.

As shown in FIG. 6, in the high-frequency signal transmission line 10a, each area A1 is located with the line A as the center and includes the portion of an opening 30a with a maximum y-axis dimension W1. Accordingly, the characteristic impedance of the signal line 20 exhibits a maximum value Z1 in the area A1. Each area A2 is between adjacent openings 30a and includes abridge 60. Accordingly, the characteristic impedance of the signal line 20 in the area A2 exhibits a minimum value Z2. Each area A3 is between the areas A1 and A2 and includes the portion of an opening 30a with a minimum y-axis dimension W2. Accordingly, the characteristic impedance of the signal line 20 exhibits an intermediate value Z3 in the area A3.

It is only necessary that the area A1 includes the portion of the opening 30a with the maximum y-axis dimension W1, and it is only necessary that the area A3 includes the portion of the opening 30a with the minimum y-axis dimension W2. Therefore, in the second preferred embodiment, the border between the areas A1 and A3 is not definitely specified. However, the border between the areas A1 and A3 may be determined, for example, as the portion of the opening 30a with the y-axis dimension calculated by (W1+W2)/2.

The high-frequency signal transmission line 10a has the same advantages as the high-frequency signal transmission line 10 that the high-frequency signal transmission line 10a can be used while bent and that the high-frequency signal transmission line 10a has reduced unnecessary radiation and reduced transmission loss of the signal line 20.

Third Preferred Embodiment

Figure 8:
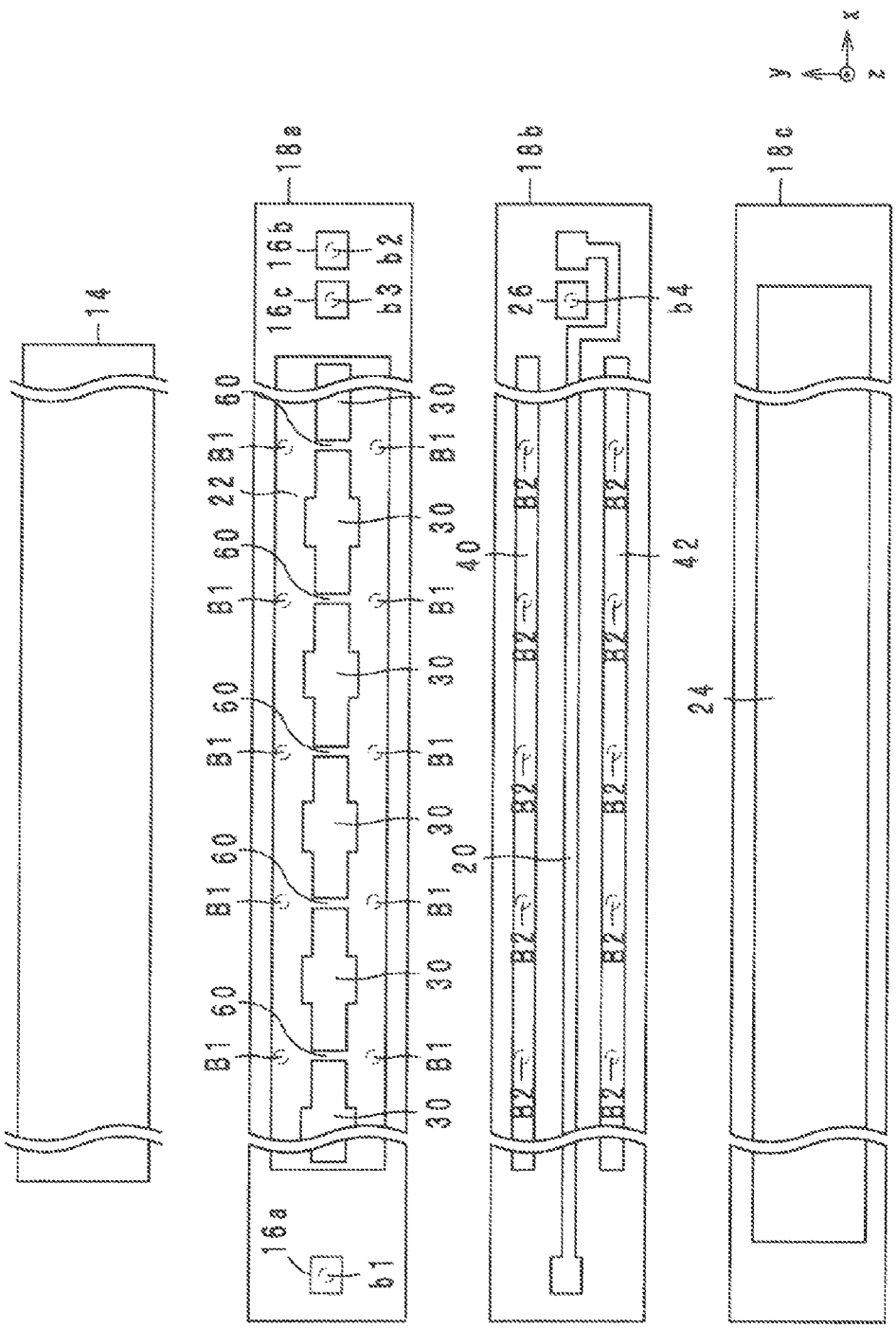
FIG. 8 is an exploded view of a high-frequency signal transmission line according to a third preferred embodiment of the present invention.

In the following, a high-frequency signal transmission line according to a third preferred embodiment will be described with reference to the drawings. FIG. 8 is an exploded view of the high-frequency signal transmission line 10b according to the third preferred embodiment.

The high-frequency signal transmission line 10b is different from the high-frequency signal transmission line 10 in that the high-frequency signal transmission line 10b preferably also includes grounding conductors 40 and 42. Specifically, in the high-frequency signal transmission line 10b, on the front surface of the dielectric sheet 18b, that is, on the same surface on which the signal line 20 is provided, the grounding conductors 40 and 42 are provided. The grounding conductor 40 is a rectangular conductor that is located in the positive side of the signal line 20 in the y-axis and that extends along the x-axis. The grounding conductor 40 is connected to the grounding conductors 22 and 24 via the via-hole conductors B1 and B2. The grounding conductor 42 is a rectangular conductor that is located in the negative side of the signal line 20 in the y-axis and that extends along the x-axis. The grounding conductor 40 is connected to the grounding conductors 22 and 24 via the via-hole conductors B1 and B2.

In the high-frequency signal transmission line 10b, the provisions of the grounding conductors 40 and 42 on both sides of the signal line 20 in the y-axis prevent unnecessary radiation from the signal line 20 to both sides in the y-axis.

Fourth Preferred Embodiment

Figure 9:
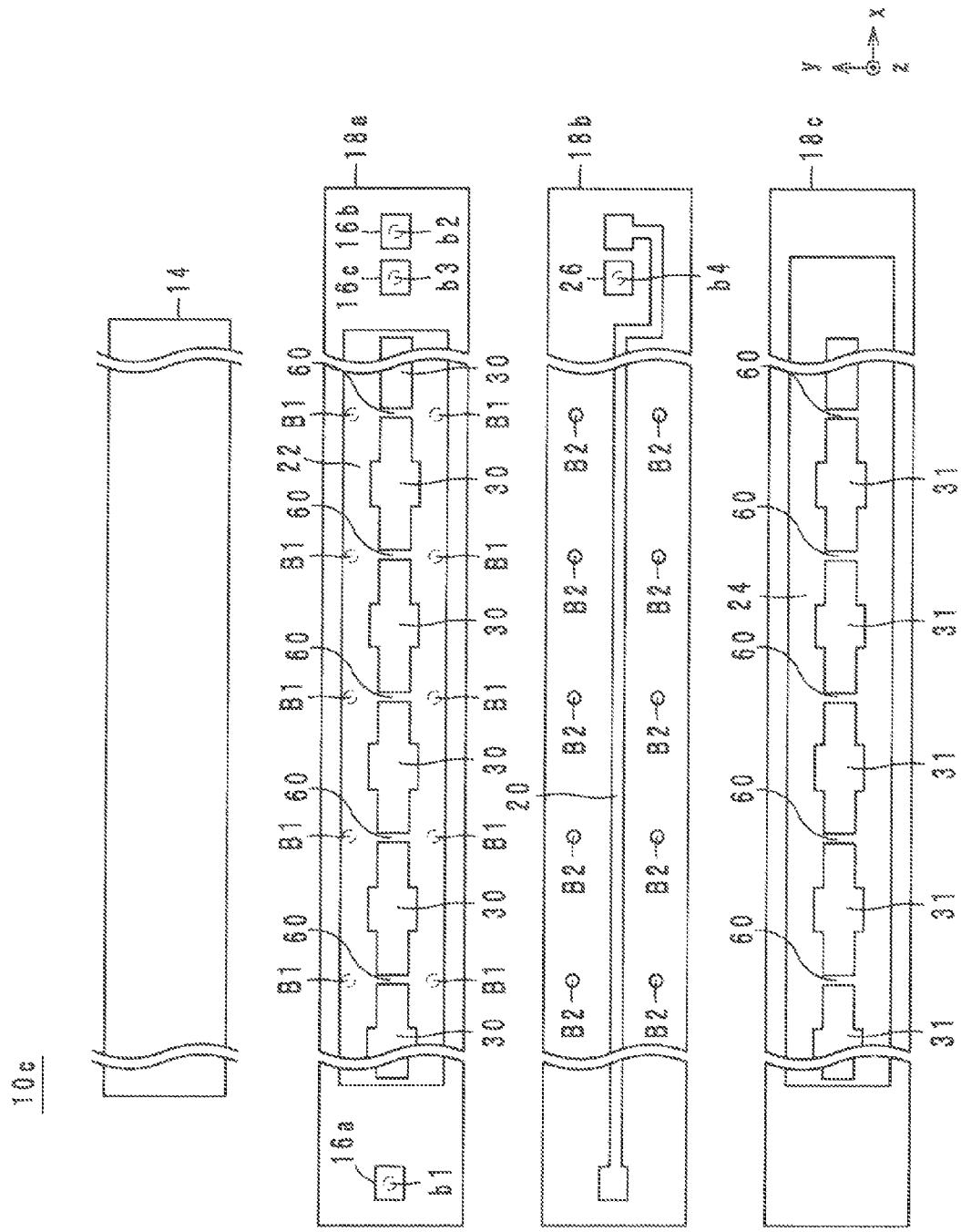
FIG. 9 is an exploded view of a high-frequency signal transmission line according to a fourth preferred embodiment of the present invention.

In the following, a high-frequency signal transmission line according to a fourth preferred embodiment will be described with reference to the drawings. FIG. 9 is an exploded view of the high-frequency signal transmission line 10c according to the fourth preferred embodiment.

The high-frequency signal transmission line 10c is different from the high-frequency signal transmission line 10 in that openings 31 of the same shape as the openings 30 are additionally provided in the grounding conductor 24 in the high-frequency signal transmission line 10c. In FIG. 9, the openings 31 are in the same places as the openings 30 when viewed along the z-axis. However, it is not necessary that the openings 31 are of the same shape of the openings 30, and the openings 31 may be arranged with a different period from the period of the openings 30 and may be arranged in different places from the openings 30 when viewed along the z-axis.

Like the high-frequency signal transmission line 10, the high-frequency signal transmission line 10c can be used while bent, and unnecessary radiation is reliably prevented. Further, in the high-frequency signal transmission line 10c, reflections of a signal in the signal line 20 can be significantly reduced and prevented.

Fifth Preferred Embodiment

Figure 10:
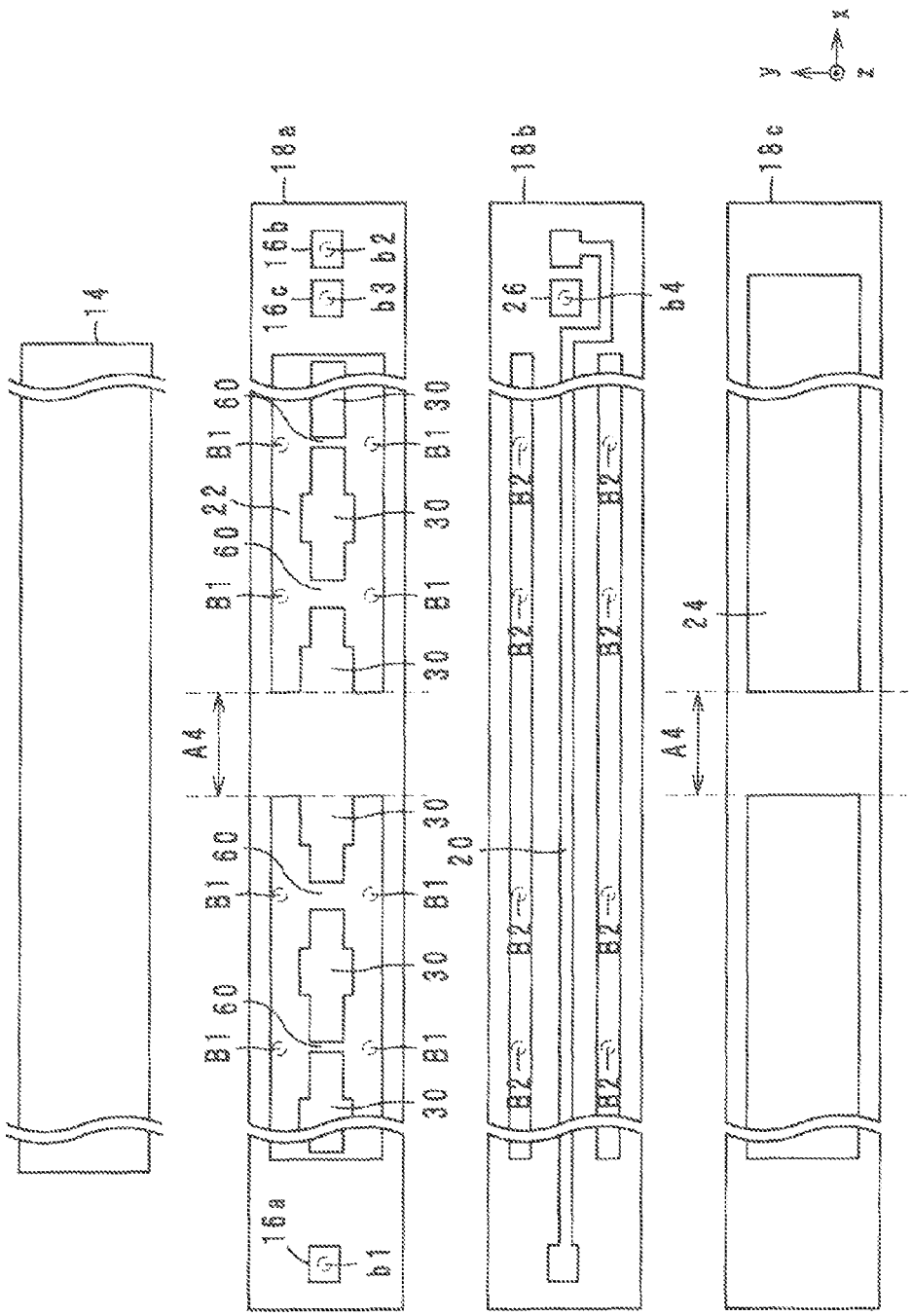
FIG. 10 is an exploded view of a high-frequency signal transmission line according to a fifth preferred embodiment of the present invention.

In the following, a high-frequency signal transmission line according to a fifth preferred embodiment will be described with reference to the drawings. FIG. 10 is an exploded view of the high-frequency signal transmission line 10d according to the fifth preferred embodiment.

The high-frequency signal transmission line 10d is different from the high-frequency signal transmission line 10b in that the high-frequency signal transmission line 10d further includes an area A4, which is a partial area in the x-axis, wherein the grounding conductors 22 and 24 are not provided. Specifically, as shown in FIG. 10, in the area A4 of the high-frequency signal transmission line 10d, the grounding conductors 22 and 24 are not provided. Accordingly, each of the grounding conductors 22 and 24 is divided into two portions. Therefore, the high-frequency signal transmission line 10d bends easily at the area A4.

The characteristic impedance in the area A4 wherein the grounding conductors 22 and 24 are not provided is high. Therefore, it is preferred to adjust the characteristic impedance around the area A4. Specifically, the bridges of the grounding conductor 22 near the area A4 preferably have greater widths than the other bridges so that the impedance at the wider bridges can be reduced.

Sixth Preferred Embodiment

In the following, a high-frequency signal transmission line according to a sixth preferred embodiment will be described with reference to the drawings. FIG. 11 is an exploded view of the high-frequency signal transmission line 10e according to the sixth preferred embodiment.

The high-frequency signal transmission line 10e is different from the high-frequency signal transmission line 10 in that openings 44a and 44b made in the grounding conductor 22 in the high-frequency signal transmission line 10e are of different shapes from the openings 30. Specifically, an opposed set of openings 44a and 44b are of the shapes formed by dividing an opening 30 into two portions, namely, the y-axis positive-side portion and the y-axis negative-side portion. In the high-frequency signal transmission line 10e, there is provided a linear conductor 46 extending in the x-axis between the openings 44a and 44b. The linear conductor 46 is a portion of the grounding conductor 22, and is located over the signal line 20 when viewed along the z-axis.

In the high-frequency signal transmission line 10e, a plurality of openings 44a are arranged in a line along the signal line 20, and a plurality of openings 44b are arranged in a line along the signal line 20. Accordingly, the characteristic impedance of the signal line 20 exhibits a maximum value Z1 in the areas A1, and the characteristic impedance of the signal line 20 exhibits an intermediate value Z3 in the areas A3. The characteristic impedance of the signal line 20 exhibits a minimum value Z2 in the areas A2.

In the high-frequency signal transmission line 10e, the width of the linear conductor 46 is smaller than the width of the signal line 20. That is, the signal line 20 protrudes from the linear conductor 46 when viewed along the z-axis. However, the width of the linear conductor 46 may be larger than the width of the signal line 20, and the signal line 20 does not necessarily protrude from the linear conductor 46 when viewed along the z-axis. In other words, the openings 44a and 44b do not necessarily overlap the signal line 20. Likewise, the openings 30, 30a and 31 do not necessarily overlap the signal line 20. In the high-frequency signal transmission line 10e, since the direction of a high-frequency current flow on the linear conductor 46 and the grounding conductors 22 and 24 is opposite to the direction of a high-frequency current flow on the signal line 20, even with the signal line 20 protruding from the linear conductor 46, the effect of preventing unnecessary radiation is stronger than in the high-frequency signal transmission line 10.

Seventh Preferred Embodiment

Figure 12:
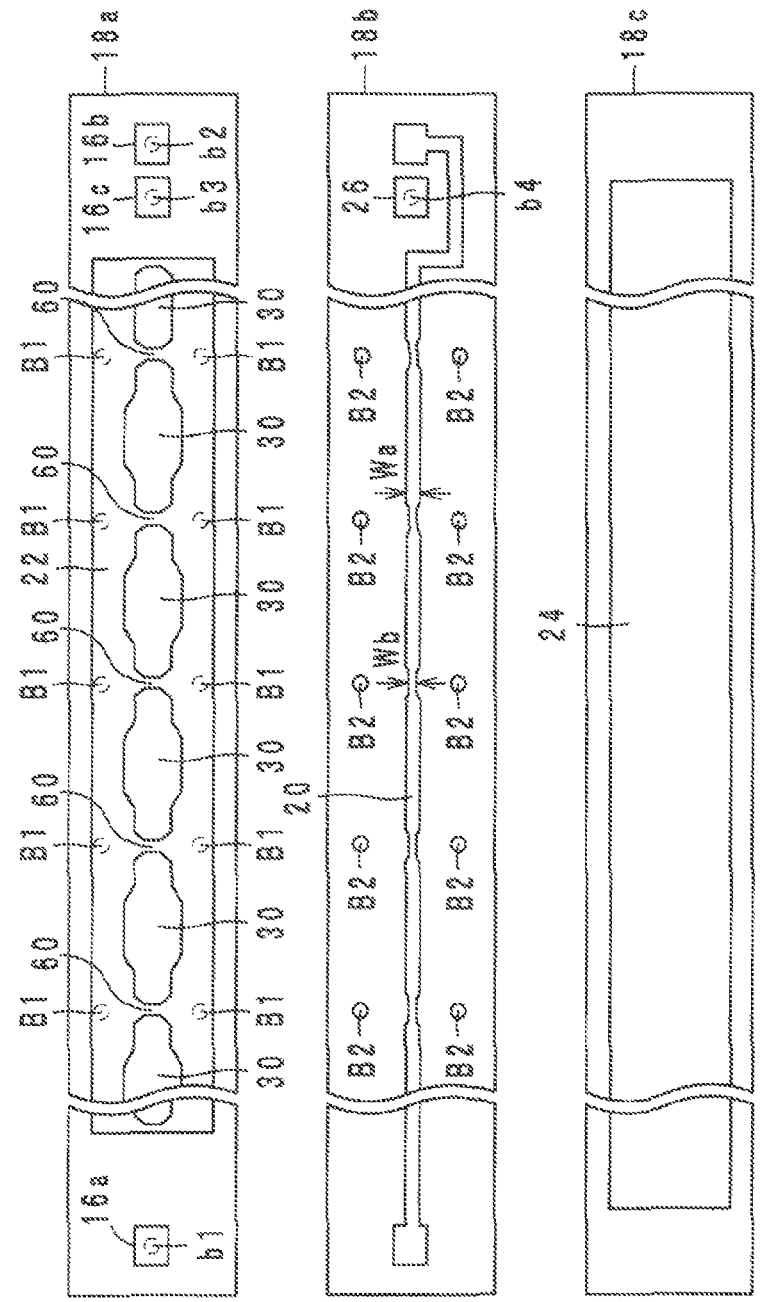
FIG. 12 is an exploded view of a high-frequency signal transmission line according to a seventh preferred embodiment of the present invention.

In the following, a high-frequency signal transmission line according to a seventh preferred embodiment will be described with reference to the drawings. FIG. 12 is an exploded view of the high-frequency signal transmission line 10f according to the seventh preferred embodiment. FIG. 13 is a transparent view of the high-frequency signal transmission line 10f, viewed from the top of a lamination direction (from the positive side in the y-axis).

A first difference between the high-frequency signal transmission line 10f and the high-frequency signal transmission line 10 is that the signal line 20 in the high-frequency signal transmission line 10f has a reduced width in the portions opposing the bridges 60, that is, the width of the signal line 20 in the portions opposing the bridges 60 are smaller than the width of the signal line 20 in the portions having a maximum characteristic impedance Z1. A second difference between the high-frequency signal transmission line 10f and the high-frequency signal transmission line 10 is that each of the openings 30 in the high-frequency signal transmission line 10f tapers from the portion where the characteristic impedance of the signal line 20 exhibits the maximum value Z1 (the portion having a y-axis dimension W1) to the portions where the characteristic impedance of the signal line exhibits an intermediate value Z3 (the portions having a y-axis dimension W2). A third difference between the high-frequency signal transmission line 10f and the high-frequency signal transmission line 10 is that each of the openings 30 in the high-frequency signal transmission line 10f tapers from the portions where the characteristic impedance of the signal line 20 exhibits the intermediate value Z3 (the portions having a y-axis dimension W2) to the bridges 60.

Now, areas A1 to A3 in the high-frequency signal transmission line 10f are defined. The areas A1 are areas where the respective openings 30 have the y-axis dimension W1. The areas A2 are areas opposed to the bridges 60. The areas A3 are areas among the areas A1 and A2, and the areas A3 include areas where the respective openings 30 have the y-axis dimension W2.

The above-mentioned first difference is described in more detail. As shown in FIGS. 12 and 13, the signal line 20 has a width Wb in the areas A2 and has a width Wa, which is greater than Wb, in the areas A1. The width Wa may be, for example, about 100 μm to about 500 μm. In this preferred embodiment, the width Wa preferably is about 350 μm, for example. The width Wb may be, for example, about 25 μm to about 250 μm. In this preferred embodiment, the width Wb preferably is about 100 μm. Thus, the width of the signal line 20 in the areas A2 is smaller than the width of the signal line 20 in the areas A1, and accordingly, the overlapping area of the signal line 20 with the bridges 60 becomes smaller. Thereby, floating capacitance occurring between the signal line 20 and the bridges 60 is reduced. Also, since the signal line 20 has the larger width Wa in the areas overlapping the openings 30, the inductance of the signal line 20 is inhibited from rising in these areas. Further, since the signal line 20 is not entirely but partly narrowed, the resistance of the signal line 20 is inhibited from rising.

The width of the signal line 20 tapers from Wa to Wb. Thereby, the resistance of the signal line 20 in the tapering areas changes gradually, and reflections of a high-frequency signal in the tapering areas can be significantly reduced and prevented.

The above-mentioned second difference is described in more detail. Each of the openings 30 has tapering portions among the portion having the y-axis dimension W1 and the portions having the y-axis dimension W2. That is, each opening 30 tapers in both x-axis ends of the area A1. Thereby, the current loss on the grounding conductor 22 is prevented.

The above-mentioned third difference is described in more detail. Each of the openings 30 has tapering portions among the portion having the y-axis dimension W2 and the bridges 60. Accordingly, each of the bridges 60 has broadened y-axis ends. That is, each of the bridges 60 has a reduced x-axis dimension in the portion crossing over the signal line 20. Thereby, floating capacitance between the bridges 60 and the signal line 20 can be significantly reduced and prevented. Also, since each of the bridges 60 is not entirely but partly narrowed, the resistance and the inductance of each of the bridges 60 are inhibited from rising.

Eighth Preferred Embodiment

Figure 14:
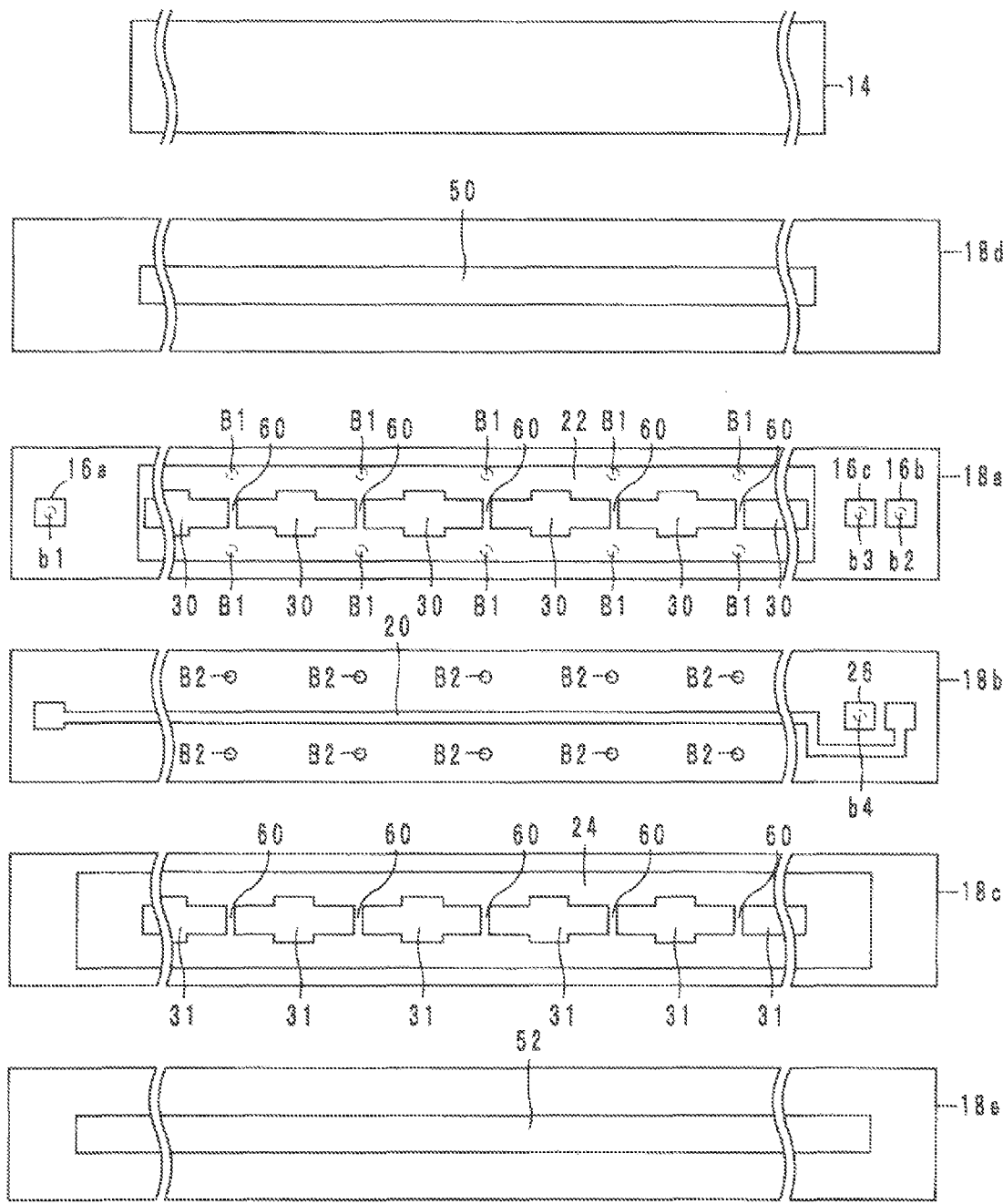
FIG. 14 is an exploded view of a high-frequency signal transmission line according to an eighth preferred embodiment of the present invention.
Figure 16A:
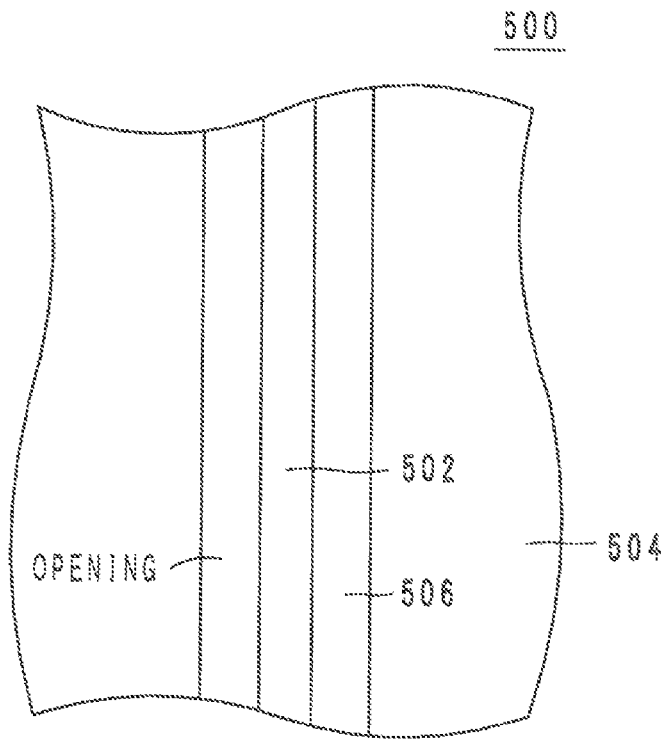
FIG. 16A is a top view of a high-frequency signal transmission line wherein a signal line is not covered from a grounding conductor, viewed from a lamination direction.
Figure 16B:
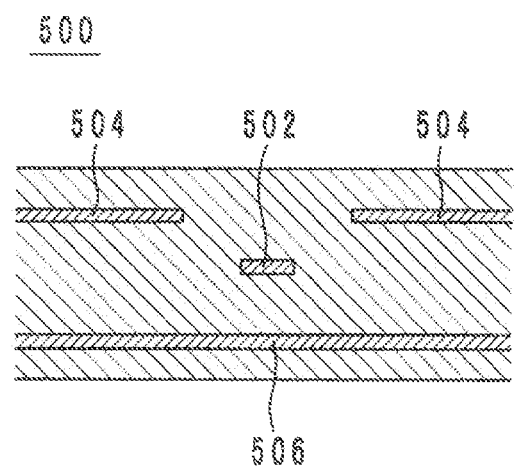
FIG. 16B is a cross-sectional view of the high-frequency signal transmission line.

In the following, a high-frequency signal transmission line according to an eighth preferred embodiment will be described with reference to the drawings. FIG. 14 is an exploded view of the high-frequency signal transmission line 10g according to the eighth preferred embodiment. FIG. 15 is a transparent view of the high-frequency signal transmission line 10g, viewed from the top of a lamination direction (from the positive side in the y-axis).

The high-frequency signal transmission line 10g is different from the high-frequency signal transmission line 10c in that floating conductors 50 and 52 are provided in the high-frequency signal transmission line 10g. Specifically, the high-frequency signal transmission line 10g preferably also includes dielectric sheets 18d and 18e, and floating conductors 50 and 52. The dielectric sheet 18d is placed on the dielectric sheet 18a in the z-axis positive side. The dielectric sheet 18e is placed on the dielectric sheet 18c in the z-axis negative side.

As shown in FIGS. 14 and 15, the floating conductor 50 is a rectangular conductor provided on the front surface of the dielectric sheet 18d. Therefore, the floating conductor 50 is located in the opposite side of the grounding conductor 22 from the signal line 20.

The floating conductor 50 is opposed to the signal line 20 and the grounding conductor 22 when viewed along the z-axis. The y-axis dimension (width) W3 of the floating conductor 50 is, as shown in FIG. 15, smaller than the width W1 of the openings 30 in the areas A1 and greater than the width W2 of the openings 30 in the areas A3. Therefore, the bridges 60 are covered by the floating conductor 50.

The floating conductor 50 is not electrically connected to any other conductors such as the signal line 20 and the grounding conductor 22, and the floating conductor 50 has a floating potential. The floating potential is between the potential of the signal line 20 and the potential of the grounding conductor 22.

The front surface (z-axis positive-side surface) of the floating conductor 50 is covered by a protector 14.

As shown in FIGS. 14 and 15, the floating conductor 52 is a rectangular conductor provided on the front surface of the dielectric sheet 18e. Therefore, the floating conductor 52 is located in the opposite side of the grounding conductor 24 from the signal line 20.

The floating conductor 52 is opposed to the signal line 20 and the grounding conductor 24 when viewed along the z-axis. The y-axis dimension (width) W3 of the floating conductor 52 is smaller than the width W1 of the openings 30 in the areas A1 and greater than the width W2 of the openings 30 in the areas A3. Therefore, the bridges 60 are covered by the floating conductor 52.

The floating conductor 52 is not electrically connected to any other conductors such as the signal line 20 and the grounding conductor 24, and the floating conductor 52 has a floating potential. The floating potential is between the potential of the signal line 20 and the potential of the grounding conductor 24.

The provisions of the floating conductors 50 and 52 inhibit fluctuations in characteristic impedance of the signal line 20. This is described in more detail. For example, when the high-frequency signal transmission line 10g is provided in a mobile telephone, there are arranged dielectrics and metals around the high-frequency signal transmission line 10g. Due to the dielectrics and metals, the characteristic impedance of the signal line 20 may change. Especially when the signal line 20 is opposed to the dielectrics and/or the metals via the openings 30 and 31, the characteristic impedance of the signal line 20 drastically changes.

In order to avoid this trouble, the floating conductors 50 and 52 are provided in the high-frequency signal transmission line 10g. The floating conductors 50 and 52 prevent the signal line 20 from being opposed directly to the dielectrics and/or the metals. Therefore, a change in characteristic impedance of the signal line 20 can be prevented.

In the high-frequency signal transmission line 10g, further, since the floating conductors 50 and 52 are opposed to the signal line 20, the characteristic impedance of the signal line 20 hardly changes even when floating capacitance occurs among the signal line 20 and the floating conductors 50 and 52. This is described in more detail. Since the floating conductors 50 and 52 are not electrically connected to the signal line 20 and the grounding conductors 22 and 24, the floating conductors 50 and 52 have a floating potential. Therefore, the floating capacitance between the signal line 20 and the floating conductor 50, the floating capacitance between the floating conductor 50 and the grounding conductor 22 and the floating capacitance between the floating conductor 52 and the grounding conductor 24 are connected in series to one another.

The width W3 of the floating conductors 50 and 52 are smaller than the width W1 of the openings 30 and 31 in the areas A1 and greater than the width W2 of the openings 30 and 31 in the areas A3. Therefore, the area where the grounding conductor 22 is opposed to the floating conductor 50 and the area where the grounding conductor 24 is opposed to the floating conductor 52 are small, and the floating capacitance between the grounding conductor 22 and the floating conductor 50 and the floating capacitance between the grounding conductor 24 and the floating conductor 52 are small. Accordingly, the total capacitance of the floating capacitance between the signal line 20 and the floating conductor 50, the floating capacitance between the floating conductor 50 and the grounding conductor 22 and the floating capacitance between the floating conductor 52 and the grounding conductor 24, which are connected in series to one another, is small.

Thus, also for this reason, the provisions of the floating conductors 50 and 52 inhibit fluctuations in characteristic impedance of the signal line 20.

Other Preferred Embodiments

The present invention provides not only the high-frequency signal transmission lines 10 and 10a to 10g according to the various preferred embodiments described above but also other high-frequency signal transmission lines modified within the scope of the present invention.

In each of the high-frequency signal transmission lines 10 and 10a to 10g, all the plurality of openings 30, 31, 44a or 44b preferably are of the same shape, for example. However, some of the openings 30, 31, 44a or 44b may be of a different shape from the other openings 30, 31, 44a or 44b. For example, specified ones of the openings 30, 31, 44a or 44b may have a greater x-axis dimension than the other openings 30, 31, 44a or 44b. In this case, each of the high-frequency signal transmission lines 10 and 10a to 10g bends easily at the portions where the specified openings 30, 31, 44a or 44b with a greater x-axis dimension are provided.

The structures of the high-frequency signal transmission line 10 and 10a to 10g may be combined with one another.

The preferred embodiments above preferably have been described with respect to high-frequency signal transmission lines of a stripline structure, for example. In each of the preferred embodiments, the second grounding conductor is not indispensable, and the high-frequency signal transmission lines may be of a microstripline structure without a second grounding conductor. Also, the dielectric body may have a signal line on one main surface and have a first grounding conductor on the other main surface.

In each of the high-frequency signal transmission lines 10 and 10a to 10g, between two adjacent bridges 60, the impedance of the signal line 20 rises from a minimum value Z2 to an intermediate value Z3 and to a maximum value Z1, and falls from the maximum value Z1 to the intermediate value Z3 and to the minimum value Z2 in this order. However, between two adjacent bridges 60, the impedance of the signal line 20 may rise from a minimum value Z2, an intermediate value Z3 to a maximum value Z1, and may fall from the maximum value Z1 to an intermediate value Z4 and to the minimum value Z2 in this order. That is, the intermediate values Z3 and Z4 may be different from each other. In this case, each of the openings 30, 31, 44a or 44b may be of a shape asymmetrical with respect to the line A. The intermediate value Z4 is preferably greater than the minimum value Z2 and smaller than the maximum value Z1.

Also, the minimum impedance value Z2 of the signal line 20 between two adjacent bridges 60 may not be always the same. In sum, it is not necessary that the signal line 20 exhibits the same minimum impedance value Z2 between any two adjacent bridges 60, as long as each of the high-frequency signal transmission lines 10 and 10a to 10g as a whole can achieve the desired characteristic impedance. The minimum value Z2 the signal line 20 exhibits at one bridge 60 is preferably smaller than the intermediate value Z3, and the minimum value Z2 that the signal line 20 exhibits at the other bridge 60 is preferably smaller than the intermediate value Z4.

As described above, various preferred embodiments of the present invention are advantageously applicable to high-frequency signal transmission lines. Particularly, various preferred embodiments of the present invention provide a flexible high-frequency transmission line that can prevent unnecessary radiation, reflections of a signal in the signal line and a transmission loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
a dielectric body including laminated dielectric layers;
a linear signal line provided in the dielectric body; and
a first grounding conductor that is opposed to the signal line via one of the dielectric layers, the first grounding conductor being of a ladder structure including a plurality of openings and a plurality of bridges alternately arranged in an extending direction of the signal line; wherein
the signal line has characteristic impedance that changes between two adjacent bridges such that the characteristic impedance rises from a minimum value to a first intermediate value and to a maximum value and falls from the maximum value to a second intermediate value and to the minimum value in this order with increasing distance from one of the adjacent bridges and with decreasing distance from the other adjacent bridge; and
the signal line has a smaller width in portions opposed to the bridges than in portions having the maximum value of characteristic impedance.

2. A high-frequency signal transmission line according to claim 1, wherein the dielectric layers are flexible.

3. A high-frequency signal transmission line according to claim 1, wherein each of the openings includes a first width in an area where the impedance of the signal line exhibits the maximum value, and includes a second width smaller than the first width in an area where the impedance of the signal line exhibits the first intermediate value, the first and second widths being dimensions in a direction perpendicular to the extending direction of the signal line.

4. A high-frequency signal transmission line according to claim 3, wherein each of the openings has a length greater than the first width, the length being a dimension in the extending direction of the signal line.

5. A high-frequency signal transmission line according to claim 1, wherein each of the openings has a shape that is symmetrical with respect to the signal line.

6. A high-frequency signal transmission line according to claim 1, wherein the first grounding conductor has no other openings between two adjacent ones of the openings.

7. A high-frequency signal transmission line according to claim 1, wherein each of the openings has a continuously decreasing width from a center of the opening to both ends in the extending direction of the signal line.

8. A high-frequency signal transmission line according to claim 1, further comprising a second grounding conductor that is opposed to the first grounding conductor such that the signal line is sandwiched between the first grounding conductor and the second grounding conductor.

9. A high-frequency signal transmission line according to claim 8, further comprising a via-hole conductor that pierces through the dielectric layers and that connects the first grounding conductor and the second grounding conductor to each other.

10. A high-frequency signal transmission line according to claim 8, wherein the signal line is located closer to the first grounding conductor than to the second grounding conductor with respect to a thickness direction of the dielectric body.

11. A high-frequency signal transmission line comprising:
a dielectric body including laminated dielectric layers;
a linear signal line provided in the dielectric body; and
a first grounding conductor that is opposed to the signal line via one of the dielectric layers, the first grounding conductor being of a ladder structure including a plurality of openings and a plurality of bridges alternately arranged in an extending direction of the signal line; wherein
a width of each of the plurality of openings decreases towards respective ones of the plurality of bridges in a step-by-step manner or a continuous manner; and
a width of each of the plurality of bridges is uniform in a region in which each of the plurality of bridges overlaps the signal line in a planar view.

* * * * *